US012765011B2

(12) United States Patent
Kang et al.

(10) Patent No.: US 12,765,011 B2
(45) Date of Patent: Oct. 13, 2026

(54) STACKED NANOSHEET DEVICE WITH STEP CONFIGURATION WHERE THE BOTTOM NANOSHEET STACK IS WIDER THAN THE TOP NANOSHEET STACK

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 621 days.

(21) Appl. No.: 17/882,952

(22) Filed: Aug. 8, 2022

(65) Prior Publication Data

US 2024/0047524 A1 Feb. 8, 2024

(51) Int. Cl.
*H10D 62/10* (2025.01)
*H10D 30/62* (2025.01)
*H10D 30/67* (2025.01)

(52) U.S. Cl.
CPC .......... *H10D 62/121* (2025.01); *H10D 30/62* (2025.01); *H10D 30/6735* (2025.01); *H10D 30/6757* (2025.01)

(58) Field of Classification Search
CPC .. H10D 62/121; H10D 30/62; H10D 30/6735; H10D 30/6757; H10D 30/797; H10D 30/014; H10D 30/43; H10D 64/017; H10D 62/822; H10D 84/0167; H10D 84/85; H10D 84/0128; H10D 84/0151; H10D 84/038; H10D 84/83; H10D 88/00; H10D 88/01
See application file for complete search history.

(56) References Cited

U.S. PATENT DOCUMENTS

| | | | |
|---|---|---|---|
| 9,461,114 | B2 | 10/2016 | Obradovic et al. |
| 10,109,533 | B1 | 10/2018 | Xie et al. |
| 10,361,131 | B2 | 7/2019 | Ando et al. |

(Continued)

FOREIGN PATENT DOCUMENTS

| | | | |
|---|---|---|---|
| CN | 111463287 | A | 7/2020 |
| EP | 3945593 | A1 | 2/2022 |
| KR | 20200090237 | A | 7/2020 |

OTHER PUBLICATIONS

Mohapatra, E., et al., "Design study of gate-all-around vertically stacked nanosheet FETs for sub-7nm nodes", SN Applied Sciences, Apr. 7, 2021, 13 pages.

*Primary Examiner* — William B Partridge
*Assistant Examiner* — Ilker Ozden
(74) *Attorney, Agent, or Firm* — Scully, Scott, Murphy & Presser, P.C.; Samuel Waldbaum

(57) ABSTRACT

An etch stop layer is provided in a vertical stack containing a bottom material stack and a top material stack. Notably, the etch stop layer is provided in an area in which a step region is desired and thus during the etch use to provide the step region the etch stops on the etch stop layer without tapering or compromising the height of the top material stack. Also, prior to gate formation, a dielectric oxide is formed in an area in proximity to the nanosheet step region and a portion thereof remains in the structure after nanosheet and functional gate structure formation.

17 Claims, 18 Drawing Sheets

(56) References Cited

U.S. PATENT DOCUMENTS

| | | | | |
|---|---|---|---|---|
| 11,121,044 | B2 | 9/2021 | Cheng et al. | |
| 11,121,233 | B2 | 9/2021 | Cheng et al. | |
| 2016/0071729 | A1 | 3/2016 | Hatcher et al. | |
| 2020/0365464 | A1 | 11/2020 | Sreenivasan et al. | |
| 2021/0272854 | A1 | 9/2021 | Cheng | |
| 2022/0336582 | A1* | 10/2022 | Jo | H10D 30/6735 |
| 2022/0367658 | A1* | 11/2022 | Yim | H10D 88/00 |
| 2023/0086084 | A1* | 3/2023 | Yun | H10D 30/43<br>257/401 |
| 2023/0343823 | A1* | 10/2023 | Baek | H10D 30/43 |
| 2023/0343824 | A1* | 10/2023 | Yun | H10D 88/00 |
| 2023/0352528 | A1* | 11/2023 | Park | H10D 84/0128 |
| 2023/0352529 | A1* | 11/2023 | Jo | H10D 62/121 |
| 2023/0378264 | A1* | 11/2023 | Song | H10D 30/6757 |

* cited by examiner

STACKED NANOSHEET DEVICE WITH STEP CONFIGURATION WHERE THE BOTTOM NANOSHEET STACK IS WIDER THAN THE TOP NANOSHEET STACK

BACKGROUND

The present application relates to semiconductor technology, and more particularly to a semiconductor structure containing a stacked nanosheet device having a step (i.e., staircase) configuration, a vertical nanosheet profile, and a height that is independent of pattern density, and a method of forming the same.

The use of non-planar semiconductor devices is the next step in the evolution of complementary metal oxide semiconductor (CMOS) devices. One type of non-planar semiconductor device that has been touted as a viable option beyond the 7 nm technology node is a nanosheet device. By "nanosheet device" it is meant that the device contains one or more layers of semiconductor channel material portions (i.e., semiconductor channel material nanosheets) having a vertical thickness that is substantially less than its width. A stacked nanosheet device including a top nanosheet device vertically stacked above a bottom nanosheet device can permit smaller scaled devices than a non-stacked nanosheet device. A step configuration can be used to provide different channel widths between the top nanosheet device and the bottom nanosheet device.

SUMMARY

An etch stop layer is provided in a vertical stack containing a bottom material stack and a top material stack. Notably, the etch stop layer is provided in an area in which a step region is desired and thus during the etch use to provide the step region the etch stops on the etch stop layer without tapering or compromising the height of the top material stack. Also, prior to gate formation, a dielectric oxide is formed in an area in proximity to the nanosheet step region and a portion thereof remains in the structure after nanosheet and functional gate structure formation.

In one aspect of the present application, a semiconductor structure is provided. In one embodiment of the present application, the semiconductor structure includes a bottom nanosheet device including a bottom stack of spaced apart bottom device semiconductor channel material nanosheets. A top nanosheet device is located above the bottom nanosheet device and includes a top stack of spaced apart top device semiconductor channel material nanosheets. The bottom stack of spaced apart bottom device semiconductor channel material nanosheets and the top stack of spaced apart top device semiconductor channel material nanosheets are arranged in a step configuration (i.e., the bottom stack of spaced apart bottom device semiconductor channel material nanosheets is wider than the top stack of spaced apart top device semiconductor channel material nanosheets such that a step region is formed). A dielectric oxide structure is located between the bottom nanosheet device and the top nanosheet device, wherein the dielectric oxide structure is spaced apart from a bottommost top device semiconductor channel nanosheet and a topmost bottom device semiconductor channel nanosheet.

In another aspect of the present application, a method of forming a semiconductor structure is provided. The method of the present application which includes etch stop layer formation as mentioned above will become more apparent from the drawings and the detailed description that follows.

DETAILED DESCRIPTION

Figure 1:
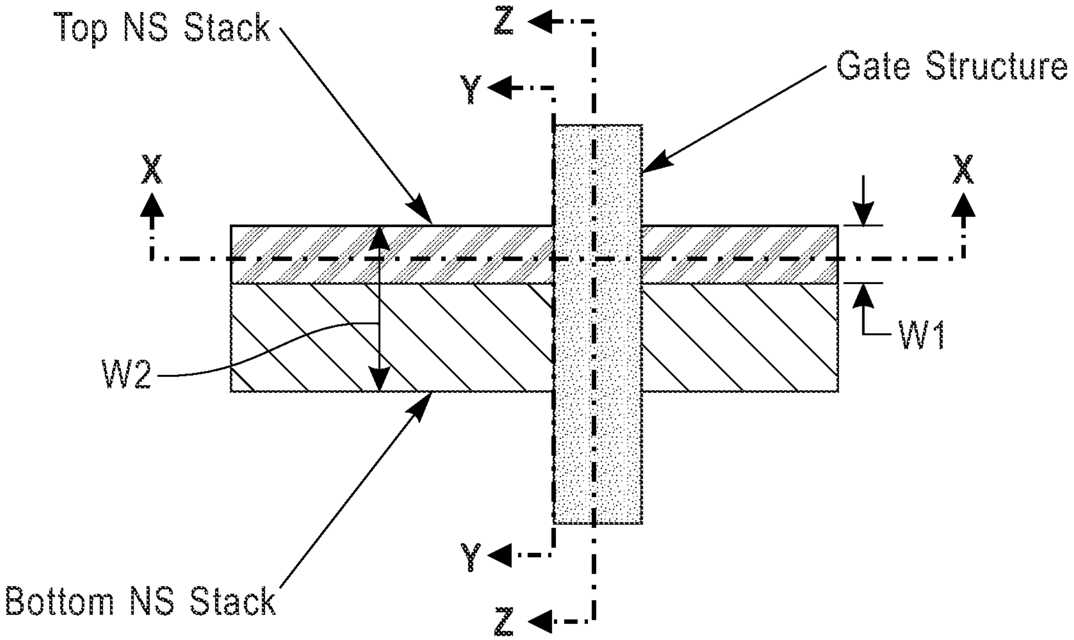
FIG. 1 is a top-down device layout including a top nanosheet (NS) stack having a first width vertically stacked above a bottom NS stack having a second width that is greater than the first width, and a gate structure that lies perpendicular to, and is in contact with, both the top NS stack and the bottom NS stack; cut X-X is along a lengthwise direction of both the bottom and top NS stacks; cut Y-Y is along an edge of the gate structure, and cut Z-Z is along a middle portion of the gate structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being “on” or “over” another element, it can be directly on the other element or intervening elements may also be present. In contrast, when an element is referred to as being “directly on” or “directly over” another element, there are no intervening elements present. It will also be understood that when an element is referred to as being “beneath” or “under” another element, it can be directly beneath or under the other element, or intervening elements may be present. In contrast, when an element is referred to as being “directly beneath” or “directly under” another element, there are no intervening elements present.

In conventional nanosheet device processing, the formation of a step region in a vertical stack containing a top material stack and a bottom material stack provides a tapered profile to the top material stack. This tapering inhibits uniform etching back of the inner spacer and, in turn, can lead to leakage of a chemical etchant into the source/drain structures during the removal of sacrificial semiconductor material nanosheets that are present in the top material stack. Also, and in conventional stacked nanosheet device processing in which a step region is formed, a height difference between the devices typically occurs which can cause issues downstream of the formation of the step region. Further, and in conventional stacked nanosheet device processing in which a step region is formed, it is difficult to control the channel width and thus the electrical property of the stacked nanosheet device can be compromised.

In the present application, an etch stop layer is provided in a vertical stack containing a bottom material stack and a top material stack. Notably, the etch stop layer is provided in an area in which a step region is desired and thus during the etch use to provide the step region the etch stops on the etch stop layer without tapering or compromising the height of the top material stack. Also, prior to gate formation, a dielectric oxide is formed in an area in proximity to the step region and a portion thereof remains in the structure after nanosheet and functional gate structure formation.

Before discussing the present application in greater detail, reference is first made to FIG. 1 which illustrates a top-down device layout that is used in the present application in describing the exemplary structures shown in FIGS. 2-20C. Notably, FIG. 1 includes a top nanosheet (NS) stack having a first width, W1, vertically stacked above a bottom NS stack having a second width, W2, that is greater than the first width, W1; note that a portion of the bottom NS extends beneath NS1. FIG. 1 also shows a gate structure that lies perpendicular to, and is in contact with, both the top NS stack and the bottom NS stack; to the left and right of the gate structure source/drain (S/D) structures are formed however the S/D structure are not shown in FIG. 1 so to highlight the stepped configuration of the structure. FIG. 1 also includes cut X-X which is along a lengthwise direction of both the bottom and top NS stacks, cut Y-Y which is along an edge of the gate structure, and cut Z-Z which is along a middle portion of the gate structure.

In the present application, FIGS. 1-14, 15B, 16B, 17B, 18B, 19B and 20B are cross sectional views along Y-Y, FIGS. 15A, 16A, 17A, 18A, 19A, and 20A are cross sectional views along cut X-X, and FIGS. 15C, 16C, 17C, 18C, 19C and 20C are cross sectional views along cut Z-Z.

Figure 2:
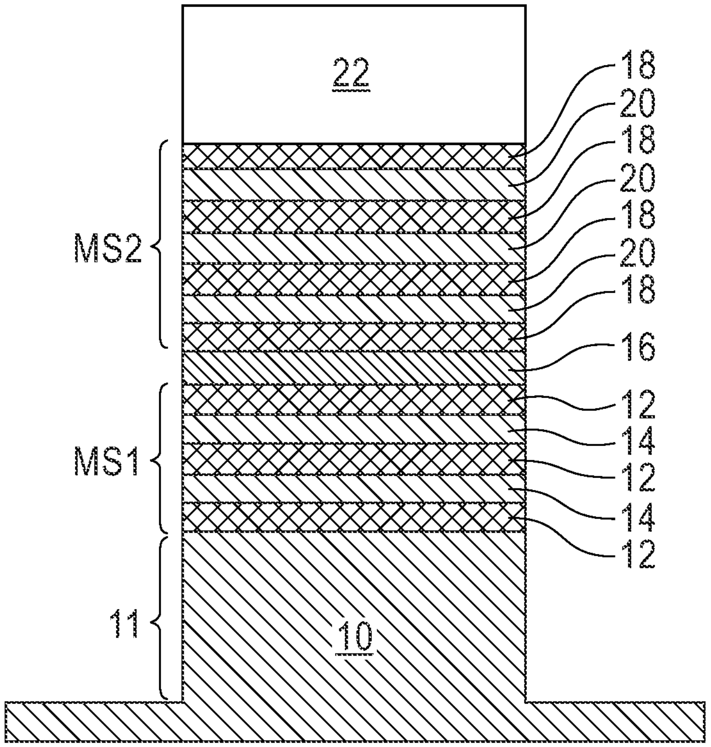
FIG. 2 is a cross sectional view through cut Y-Y illustrated in FIG. 1 of an exemplary structure that can be employed in the present application, the exemplary structure includes a vertical stack of a bottom material stack, MS1, a sacrificial placeholder material layer, and a second material nanosheet stack, MS2, that is located on a mesa region of a semiconductor substrate, and a hard mask is located on a topmost surface of the vertical stack.

Referring now to FIG. 2, there is illustrated an exemplary structure (through cut Y-Y shown in FIG. 1) that can be employed in the present application. The exemplary structure illustrated in FIG. 2 includes a vertical stack of a bottom material stack, MS1, a sacrificial placeholder material layer 16, and a top material stack, MS2, that is located on a mesa region 11 of a semiconductor substrate 10. The term "mesa region" is used throughout the present application to denote a non-etched portion of the semiconductor substrate 10 having a height that is greater than an etched portion of the semiconductor substrate 10. As is shown, hard mask 22 is located on a topmost surface of the vertical stack.

The cross sectional view in FIG. 2 illustrates the width of the vertical stack containing the first material stack, MS1, the sacrificial placeholder material layer 16 and the top material stack, MS2. Although the present application illustrates only a single vertical stack, the present application contemplates embodiments in which a plurality of such vertical stacks are employed.

The semiconductor substrate 10 (including mesa region 11) that can be employed in the present application is composed of one or more semiconductor materials having semiconducting properties. Substrate 10 is typically a bulk semiconductor substrate. Examples of semiconductor materials that can be used to provide the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors.

The bottom material stack, MS1, includes alternating bottom device sacrificial semiconductor material layers 12 and bottom device semiconductor channel material layers 14. The bottom material stack, MS1, includes 'n' bottom device semiconductor channel material layers 14 and 'n+1' bottom device sacrificial semiconductor layers 12, wherein n is at least 1. Each bottom device semiconductor channel material layer 14 within the bottom material stack, MS1, is sandwiched between a lower device bottom sacrificial semiconductor material layer and an upper bottom device sacrificial semiconductor material layer, as is shown in FIG. 2. By way of one example, the bottom material stack MS1, includes two bottom device semiconductor channel material layers 14 and three bottom device sacrificial semiconductor material layers 12.

Each bottom device sacrificial semiconductor material layer 12 is composed of a first semiconductor material, while each bottom device semiconductor channel material layer 14 is composed of a second semiconductor material that is compositionally different from the first semiconductor material. In some embodiments, the bottom device semiconductor channel material layers 14 are composed of a second semiconductor material capable of providing high channel mobility for NFET devices. In other embodiments, the bottom device semiconductor channel material layers 14 are composed of a second semiconductor material capable of providing high channel mobility for PFET devices.

The first semiconductor material that provides each bottom device sacrificial semiconductor material layer 12 and the second semiconductor material that provides each bottom device semiconductor channel material layer 14 can include one of the semiconductor materials mentioned above for semiconductor substrate 10. In the present application, the first semiconductor material that provides each bottom device sacrificial semiconductor material layer 12 can be compositionally the same as, or compositionally different from, at least an uppermost portion of the semiconductor substrate 10. Typically, the first semiconductor material that provides each bottom device sacrificial semiconductor material layer 12 is compositionally different from at least the uppermost portion of the semiconductor substrate 10. The second semiconductor material that provides each bottom device semiconductor channel material layer 14 can be compositionally the same as, or compositionally different from, at least an uppermost portion of the semiconductor substrate 10. Typically, the second semiconductor material that provides each bottom device semiconductor channel material layer 14 is compositionally the same as that of at least the uppermost portion of the semiconductor substrate 10. In one example, the semiconductor substrate 10 is composed of silicon, the first semiconductor material that provides each bottom device sacrificial semiconductor material layer 12 is composed of a silicon germanium alloy, and the second semiconductor material that provides each bottom device semiconductor channel material layer 14 is composed of silicon. Other combinations of semiconductor materials are possible as long as the first semiconductor material that provides each bottom device sacrificial semiconductor material layer 12 is compositionally different from the second semiconductor material that provides each bottom device semiconductor channel material layer 14.

The top material stack, MS2, includes alternating top device sacrificial semiconductor material layers 18 and top device semiconductor channel material layers 20. The top material stack, MS2, includes 'm' top device semiconductor channel material layers 20 and 'm+1' top device sacrificial semiconductor layers 18, wherein m is at least 1. Each top device semiconductor channel material layer 20 within the top material stack, MS2, is sandwiched between a lower top device sacrificial semiconductor material layer and an upper top device sacrificial semiconductor material layer, as is shown in FIG. 2. By way of one example, the top material stack MS2, includes three top device semiconductor channel material layers 20 and four top device sacrificial semiconductor material layers 18. In some embodiments, n is equal to m. In other embodiments, n is greater than, or less than, m. FIG. 2 illustrates an embodiment in which n is less than m, thus the top material stack, MS2, contains a greater number of top device sacrificial semiconductor material layers 18 and top device semiconductor channel material layers 20 than the number of bottom device sacrificial semiconductor material layers 12 and bottom device semiconductor channel material layers 14 that are present in the bottom material stack, MS1.

Each top device sacrificial semiconductor material layer 18 is composed of a third semiconductor material, while each top device semiconductor channel material layer 20 is composed of a fourth semiconductor material that is compositionally different from the third semiconductor material. In some embodiments, the top device semiconductor channel material layers 20 are composed of a second semiconductor material capable of providing high channel mobility for NFET devices. In other embodiments, the top device semiconductor channel material layers 20 are composed of a second semiconductor material capable of providing high channel mobility for PFET devices.

The third semiconductor material that provides each top device sacrificial semiconductor material layer 18 and the fourth semiconductor material that provides each top device semiconductor channel material layer 20 can include one of the semiconductor materials mentioned above for semiconductor substrate 10.

In the present application, the third semiconductor material that provides each top device sacrificial semiconductor material layer 18 can be compositionally the same as, or compositionally different from, the first semiconductor material that provides each bottom device sacrificial semiconductor material 12. Typically, the first and third semiconductor materials are compositionally the same, thus each bottom device sacrificial semiconductor material layer 12 and each top device sacrificial semiconductor material layer 18 are composed of a compositionally same semiconductor material. In one example, the first and third semiconductor materials are both composed of a silicon germanium alloy having a germanium content of 30 atomic percent.

In the present application, the fourth semiconductor material that provides each top device semiconductor channel material layer 20 can be compositionally the same as, or compositionally different from, the second semiconductor material that provides each bottom device semiconductor channel material 14. Typically, the second and fourth semiconductor materials are compositionally the same, thus each bottom device semiconductor channel material layer 14 and each top device semiconductor channel material layer 20 are composed of a compositionally same semiconductor material. In one example, the second and fourth semiconductor materials are both composed of a silicon.

The sacrificial placeholder material layer 16 can be composed of a fifth semiconductor material that is compositionally different from each of the first, second, third and fourth semiconductor materials. In one example, the first and third semiconductor materials are composed of a silicon germanium alloy in which the germanium content is 30 atomic percent, the second and fourth semiconductor materials are composed of silicon, and the fifth semiconductor material is composed of a silicon germanium alloy having a germanium content of 55 atomic percent.

The hard mask 22 is composed of any dielectric hard mask material including, but not limited to, silicon dioxide, silicon nitride, silicon oxynitride or a multilayered stack of two of more of such dielectric hard mask materials.

The vertical stack shown in FIG. 2 can be formed by first depositing alternating blanket layers of the bottom device sacrificial semiconductor material (i.e., first semiconductor material) and bottom device semiconductor channel material (i.e., second semiconductor material) that will be contained in the bottom material stack, MS1, second depositing a blanket layer of the sacrificial placeholder material (i.e., the fifth semiconductor material), and third depositing alternating blanket layers of the top device sacrificial semiconductor material (i.e., the third semiconductor material) and the top device semiconductor channel material (i.e., the fourth semiconductor material) that will be contained in the top material stack, MS2. The first depositing, second depositing and third depositing can include a same, or different deposition process including, but not limited to, chemical vapor deposition (CVD), plasma enhanced chemical vapor deposition (PECVD) or epitaxial growth. In one example, the first depositing, second depositing and third depositing each includes an epitaxial growth process. In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). In some embodiments, the epitaxial growth can be performed at a temperature of from 300° C. to 800° C. The epitaxial growth can be performed utilizing any well-known precursor gas or gas mixture. Carrier gases like hydrogen, nitrogen, helium and argon can be used.

A blanket layer of hard mask material is then formed of the topmost blanket layer of the top device sacrificial semiconductor material (i.e., the fourth semiconductor material). The blanket layer of hard mask material can be formed by a deposition process such as, for example, CVD, PECVD, physical vapor deposition (PVD) or atomic layer deposition (ALD). The blanket layer of hard mask material can have a thickness from 20 nm to 100 nm; although other thicknesses are contemplated and can be used as the thickness of the blanket layer of hard mask material.

After the forming the blanket layer of hard mask material, the various blanket deposited layers are patterned by lithography and etching to provide the vertical stack illustrated in FIG. 2. The etching includes one of more etching processes (dry etching, wet etching or any combination thereof). In some embodiments, the etch can remove a portion of the semiconductor substrate 10 to provide mesa region 11 shown in FIG. 2. In other embodiments, the etch stops on a topmost surface of the semiconductor substrate 10 and thus no mesa region 11 is formed. In the vertical stack, the bottom material stack, MS1 typically has a sidewall that is vertically aligned with a sidewall of each of the sacrificial placeholder material layer 16, and the top material stack, MS2. In the vertical stack, each sacrificial semiconductor material layer 12 and 18, each semiconductor channel material layer 14 and 20, and the sacrificial placeholder material layer 16 can have a width from 6 nm to 100 nm, and a height (i.e., vertical thickness) from 5 nm to 20 nm. The vertical thicknesses of each of the sacrificial semiconductor material layers 12 and 18, the semiconductor channel material layers 14 and 20, and the sacrificial placeholder material layer 16 can be the same or different from each other. The hard mask 22 typically has the same width as the vertical stack as is shown in FIG. 2.

Figure 3:
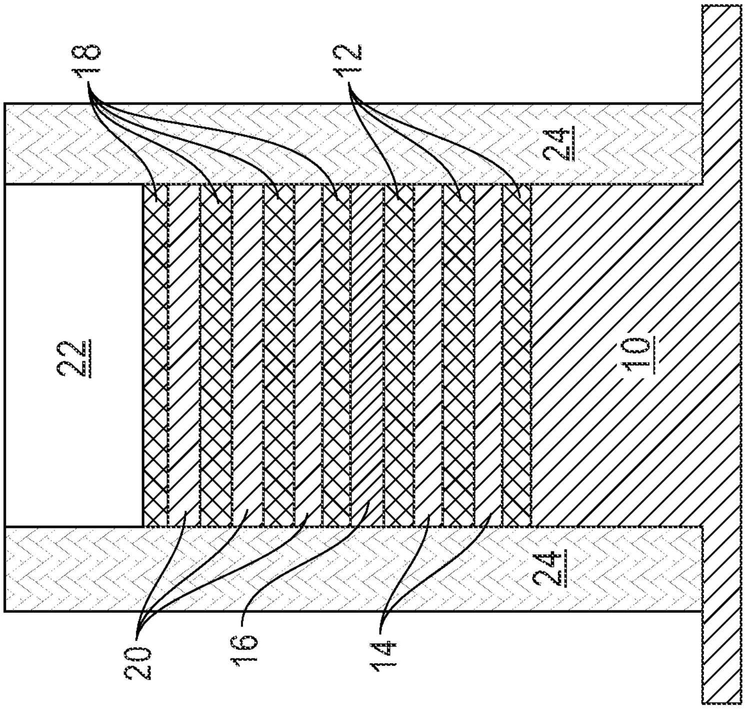
FIG. 3 is a cross sectional view of the exemplary structure shown in FIG. 2 after forming a sacrificial spacer laterally surrounding the vertical stack and the hard mask.

Referring now to FIG. 3, there is illustrated the exemplary structure shown in FIG. 2 after forming a sacrificial spacer 24 laterally surrounding the vertical stack and the hard mask 22. The sacrificial spacer 24 can also laterally surrounds the mesa region 11 of the semiconductor substrate, if the same is present. The sacrificial spacer 24 has a topmost surface that is coplanar with a topmost surface of the hard mask 22, and a bottommost surface that directly contacts the semiconductor substrate 10 (in the illustrated embodiment, the bottommost surface of the sacrificial spacer 24 directly contacts a recessed semiconductor surface of the semiconductor substrate 10). The sacrificial spacer 24 is composed of a spacer dielectric material which is compositionally different from the hard mask material that provides hard mask 22. Examples of spacer dielectric materials that can be used to provide the sacrificial spacer 24 include, but are not limited to, silicon dioxide, silicon nitride, silicon oxynitride, SiCOH, or SiCO. The sacrificial spacer 24 can be formed by a deposition process, followed by a spacer etch. The deposition process can include, but is not limited to, CVD, PECVD, ALD, spin-on coating or PVD.

Figure 4:
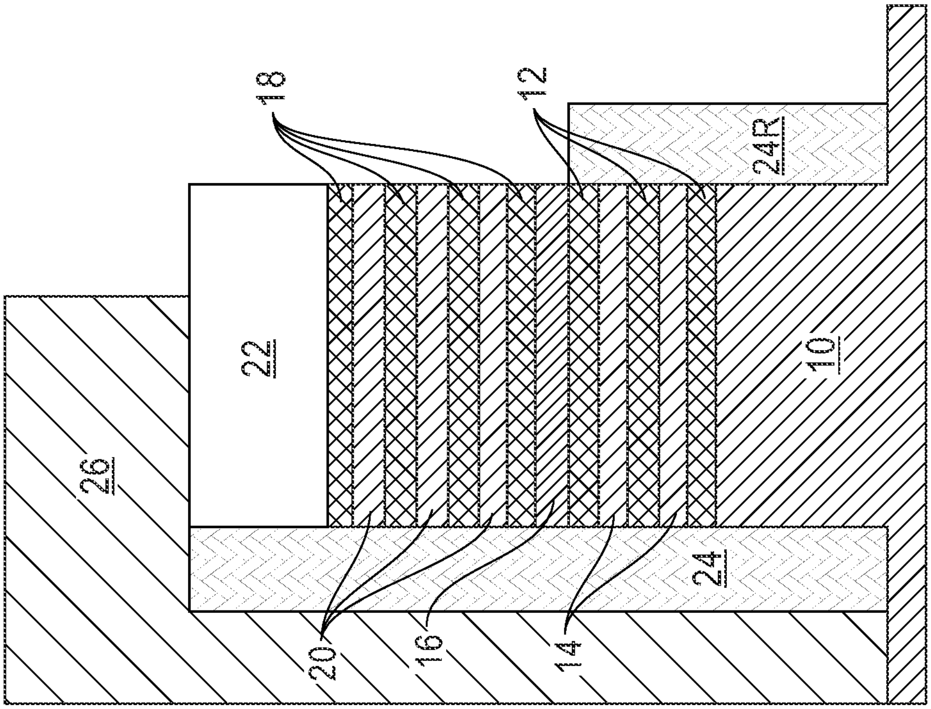
FIG. 4 is a cross sectional view of the exemplary structure shown in FIG. 3 after forming a first organic planarization layer (OPL) protecting one side of the vertical stack and reducing the height of the sacrificial spacer not protected by the first OPL so as to physically expose a sidewall of the sacrificial placeholder material layer.

Referring now to FIG. 4, there is the illustrated exemplary structure shown in FIG. 3 after forming a first organic planarization layer (OPL) 26 protecting one side of the vertical stack and reducing the height of the sacrificial spacer 24 not protected by the first OPL 26 so as to physically expose a sidewall of the sacrificial placeholder material layer 16. The first OPL 26 is formed by deposition and lithography. As is illustrated, a portion of the first OPL 26 can extend partially across a topmost surface of the hard mask 22. The reducing the height of the sacrificial spacer 26 on the side of the vertical stack that is not protected by the first OPL 26 includes an etching process (dry or wet etch) that is selective in removing the spacer dielectric material that provides the sacrificial spacer 24. In one example, a dry etching process such as, for example, reactive ion etching (RIE), is employed to reduce the height of the sacrificial spacer 24. The sacrificial spacer having the reduced height can be referred to as a reduced height sacrificial spacer 24R.

Figure 5:
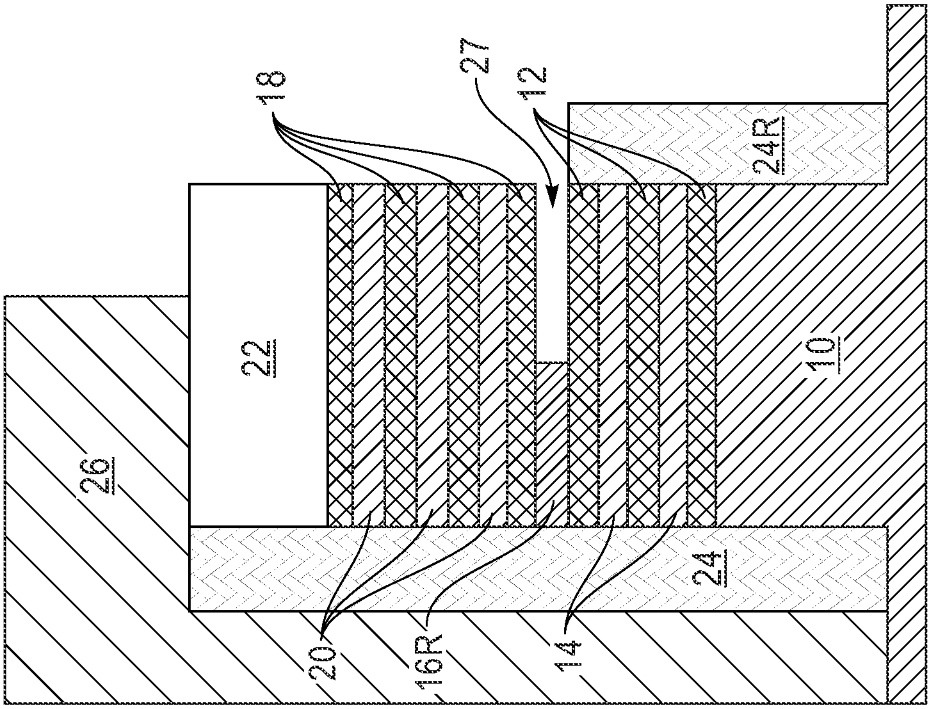
FIG. 5 is a cross sectional view of the exemplary structure shown in FIG. 4 after recessing the sacrificial placeholder material layer to provide a recessed sacrificial placeholder material layer.

Referring now to FIG. 5, there is illustrated the exemplary structure shown in FIG. 4 after recessing the sacrificial placeholder material layer 16 to provide a recessed sacrificial placeholder material layer 16R. The recessing of the sacrificial placeholder material layer 16 occurs on the same side of the vertical stack including the reduced height sacrificial spacer 24R; the first OPL 26 remains on the exemplary structure during the recessing of the sacrificial placeholder material layer 16. The recessing of the sacrificial placeholder material layer 16 includes a lateral etching process that is selective in removing the fifth semiconductor material that provides the sacrificial placeholder material layer 16. After recessing of the sacrificial placeholder material layer 16, gap 27 is formed between a portion of the bottom material stack, MS1, and the top material stack, MS2. The recessed sacrificial placeholder material layer 16R has a width that is now less than a width of the original sacrificial placeholder material layer 16. The width of gap 27 that is formed is wider than the step region to be subsequently formed.

Figure 6:
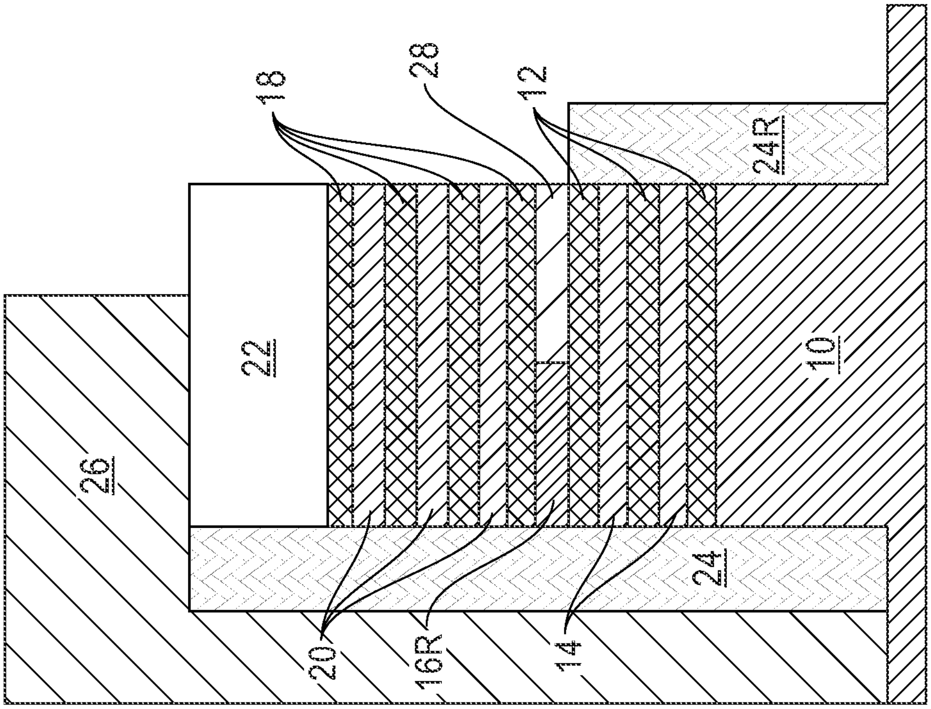
FIG. 6 is a cross sectional view of the exemplary structure shown in FIG. 5 after forming an etch stop layer in a gap that is located laterally adjacent to the recessed sacrificial placeholder material layer.

Referring now to FIG. 6, there is illustrated the exemplary structure shown in FIG. 5 after forming an etch stop layer 28 in gap 27 that is located laterally adjacent to the recessed sacrificial placeholder material layer 16R. In some embodiments, the etch stop layer 28 is composed of one of the hard mask materials mentioned above for hard mask 22. The etch stop layer 28 can be composed of a hard mask material that is compositionally the same as, or compositionally different from, the hard mask material that provides hard mask 22. In other embodiments, the etch stop layer 28 is composed of a dielectric material such as, for example, SiCOH or SiCO, which is compositionally different from the dielectric spacer material that provides sacrificial spacer 24. The etch stop layer 28 can be formed by deposition, followed by an etch back step. The deposition can include, but is not limited to, CVD, PECVD, PVD, or ALD. The etch stop layer 28 has a first sidewall that directly contacts a sidewall of the recessed sacrificial placeholder material layer 16R and a second sidewall, opposite the first sidewall, which is vertically aligned to one of the sidewalls of the vertical stack.

Figure 7:
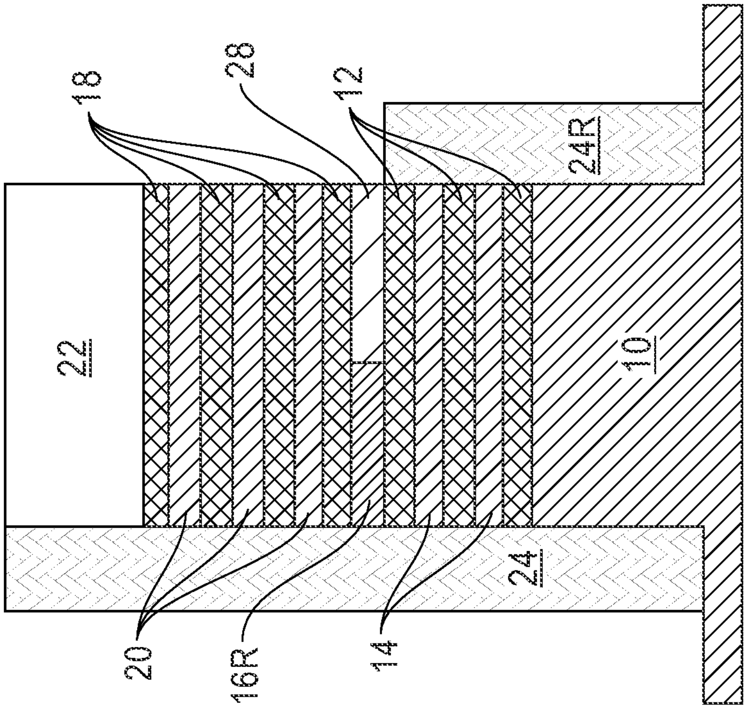
FIG. 7 is a cross sectional view of the exemplary structure shown in FIG. 6 after removing the first OPL.

Referring now to FIG. 7, there is illustrated the exemplary structure shown in FIG. 6 after removing the first OPL 26. The first OPL 26 can be removed utilizing a material removal process such as, for example, ashing, which is selective in removing the first OPL 26.

Figure 8:
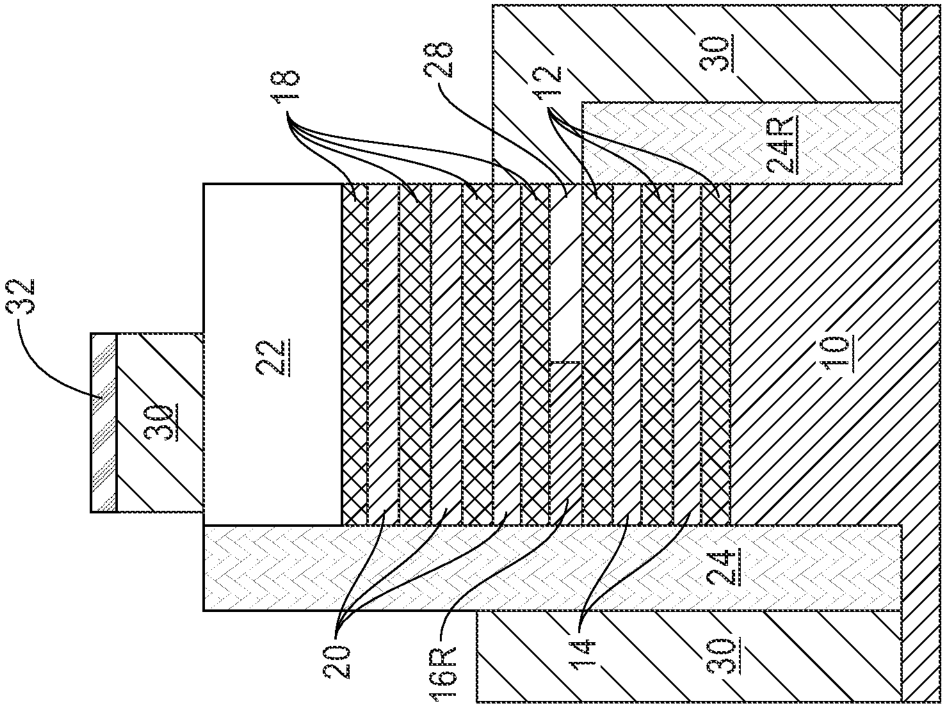
FIG. 8 is a cross sectional view of the exemplary structure shown in FIG. 7 after forming a second OPL laterally adjacent to the vertical stack and on top of a portion of the hard mask that is present on the vertical stack.

Referring now to FIG. 8, there is illustrated the exemplary structure shown in FIG. 7 after forming a second OPL 30 laterally adjacent to the vertical stack and on top of a portion of the hard mask 22 that is present on the vertical stack. As is illustrated, the second OPL 30 has a first portion that contacts sacrificial spacer 24, a second portion that contacts the reduced height sacrificial spacer 24R and the second sidewall of the etch stop layer 28 and a sidewall of a lower portion of the top material stack, MS2, and a third portion that is on top of the hard mask 22. Patterned masking layer 32 is located on the third portion of the second OPL 30. The patterned masking layer 32 includes a bottom antireflective coating and a photoresist material.

The second OPL 30 can be formed by deposition and lithography. The patterned masking layer 32 can be formed by deposition and lithography as well. The patterned masking layer 32 will be used as a mask to define the step region in the structure. The patterned masking layer 32 is typically not aligned to any sidewall of the vertical stack as is shown in FIG. 8.

Figure 9:
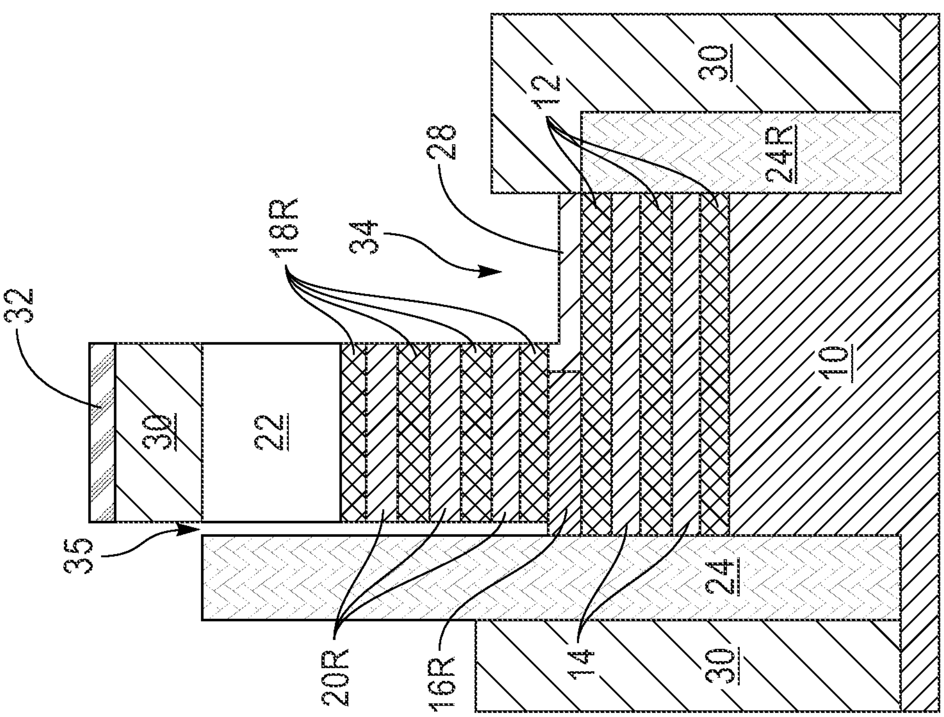
FIG. 9 is a cross sectional view of the exemplary structure shown in FIG. 8 after removing portions of the top material stack that are not protected by the second OPL, wherein the removal stops on the etch stop layer.

Referring now to FIG. 9, there is illustrated the exemplary structure shown in FIG. 8 after removing portions of the top material stack, MS2, that are not protected by the second OPL 20 and the patterned masking layer 32, wherein the removal stops on the etch stop layer 28. Step region 34 is created at this point of the present application. The term "step region" denotes a region in the vertical stack in which the bottom material stack, MS1, has a width that is greater than a width of the top material stack, MS2. The presence of the etch stop layer 28 helps to maintain a constant height to the top material stack, MS2, across the entire macro. Also, this step ensures that the reduced width top material stack, MS2, has a vertical profile as is shown in FIG. 9.

The removal of the portions of the top material stack, MS2, that are not protected by the second OPL 30 and the patterned masking layer 32, can include one or more etching processes. Note that in addition to forming the step region 34, other portions of the top material stack, MS2, that are not protected by the second OPL 30 and the patterned masking layer 32 and that are located on the opposite side than step region 34 are also removed forming a gap 35 between the reduced width top material stack, MS2, and the sacrificial spacer 24.

Figure 10:
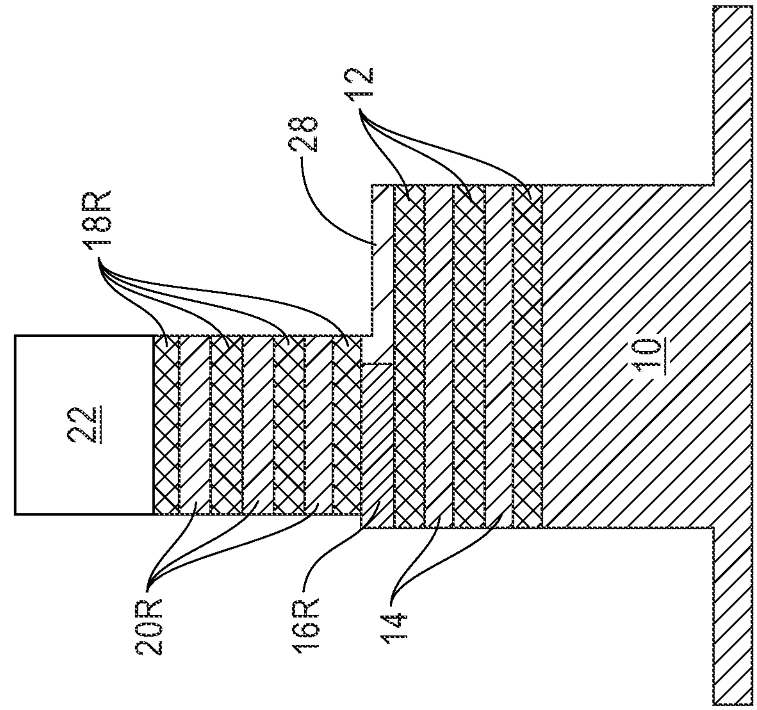
FIG. 10 is a cross sectional view of the exemplary structure shown in FIG. 9 after removing the second OPL and sacrificial spacers.

Referring now to FIG. 10, there is illustrated the exemplary structure shown in FIG. 9 after removing the second OPL 30 and sacrificial spacers 24, 24R. Prior to removing the second OPL 30, patterned masking layer 32 is first removed utilizing a first material removal process, then the second OPL 30 is removed utilizing a second material removal process, and thereafter, the sacrificial spacers 24, 24R are removed utilizing a third material removal process. The first and second material removal processes can include ashing, while the third material removal process includes an etching process that is selective in removing the dielectric spacer material that provides the sacrificial spacer 24 and the reduced height sacrificial spacer 24R.

Figure 11:
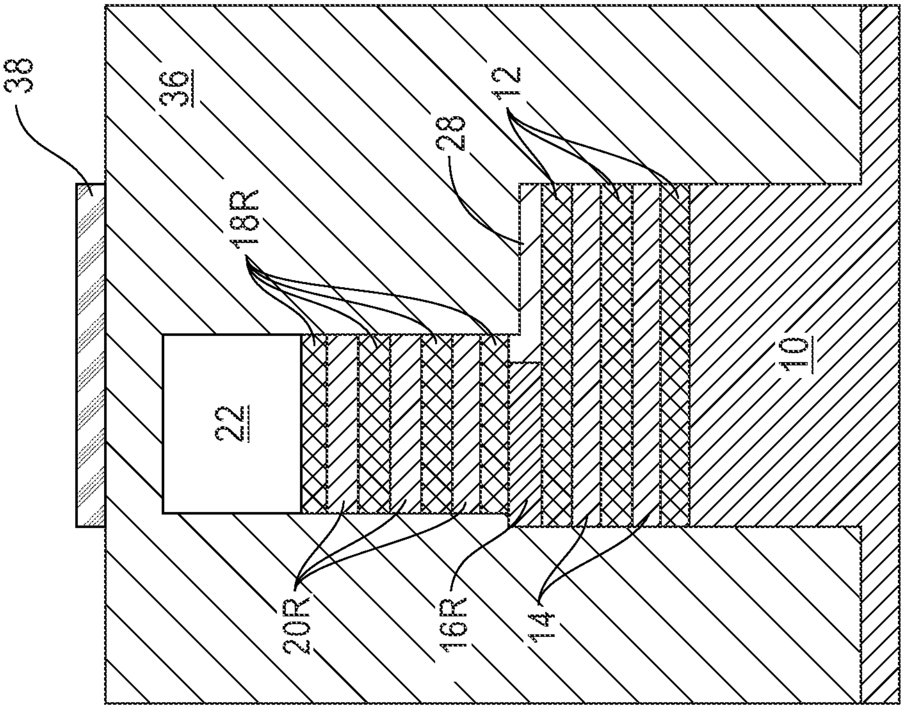
FIG. 11 is a cross sectional view of the exemplary structure shown in FIG. 10 after forming a third OPL and a trim mask.

Referring now to FIG. 11, there is illustrated the exemplary structure shown in FIG. 10 after forming a third OPL 36 and a trim mask 38. The third OPL 36 can be formed by deposition and lithography and it is formed laterally adjacent to and above the exemplary structure shown in FIG. 10. The trim mask 38 can be formed by deposition and lithography as well. The trim mask 38 will be used as a mask to align the sidewalls of the bottom material stack, MS1, and the top material stack, MS2, on a side of the vertical stack not including step region 34. Trim mask 38 can include a bottom antireflection coating and a photoresist material, and it is positioned on top of the third OPL 36 and located above the vertical stack including the first and top material stacks, MS1 and MS2. Trim mask 38 has one sidewall that is vertically aligned to a sidewall of the top material stack, MS2, opposite the sidewall of the top material stack, MS2, that is located in proximity to the step region 34.

Figure 12:
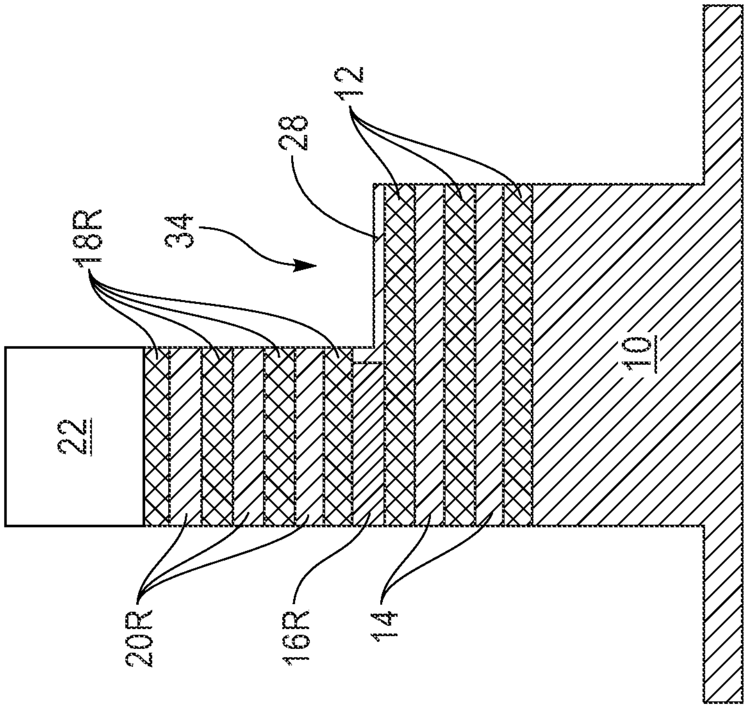
FIG. 12 is a cross sectional view of the exemplary structure shown in FIG. 11 after trimming the bottom material stack, and removing both the trim mask and the third OPL.

Referring now to FIG. 12, there is illustrated the exemplary structure shown in FIG. 11 after trimming the bottom material stack, MS1, and removing both the trim mask 38 and the third OPL 36. The trimming of the bottom material stack, MS1, includes one or more etching processes (dry etching and/or chemical wet etching). In one example, the trimming includes a reactive ion etch. After this trimming and as shown in FIG. 12, the sidewalls of the bottom material stack, MS1, and the top material stack, MS2, on a side of the vertical stack not including step region 34 are now vertically aligned. The trim mask 38 and the third OPL 36 can be removed utilizing one or more material removal processes. During the removal of the third OPL 36, some thinning of the etch stop layer 28 can occur as is shown in FIG. 12.

Figure 13:
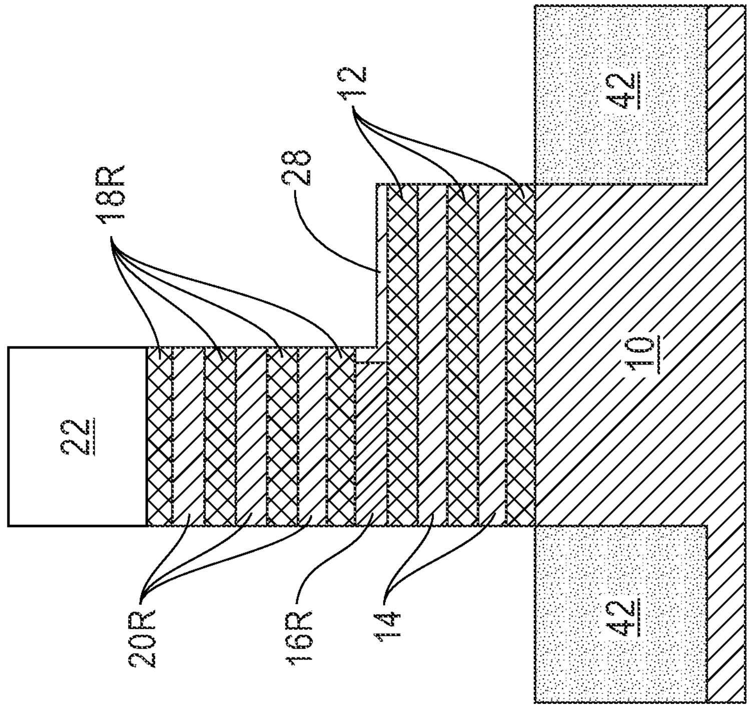
FIG. 13 is a cross sectional view of the exemplary structure shown in FIG. 12 after forming a trench isolation structure laterally adjacent to the mesa region of the semiconductor substrate.

Referring now to FIG. 13, there is illustrated the exemplary structure shown in FIG. 12 after forming a trench isolation structure 42 laterally adjacent to the mesa region 11 of the semiconductor substrate 10. Trench isolation structure 42 includes at least a trench dielectric material such as, for example, silicon dioxide. In some embodiments, not shown, trench isolation structure 42 includes a trench dielectric liner that is located between the trench dielectric material and the semiconductor substrate 10 (including mesa region 11). The trench isolation structure 42 can be formed by deposition of at least the trench dielectric material, followed by an etch back process. The trench isolation structure 42 typically has a topmost surface that is coplanar with a topmost surface of the mesa region 11 of the semiconductor substrate 10. In embodiments in which no mesa region 11 is present, the trench isolation structure 42 can be formed by first providing a trench into the semiconductor substrate, and then depositing at least the trench dielectric material, followed by an etch back process.

Figure 14:
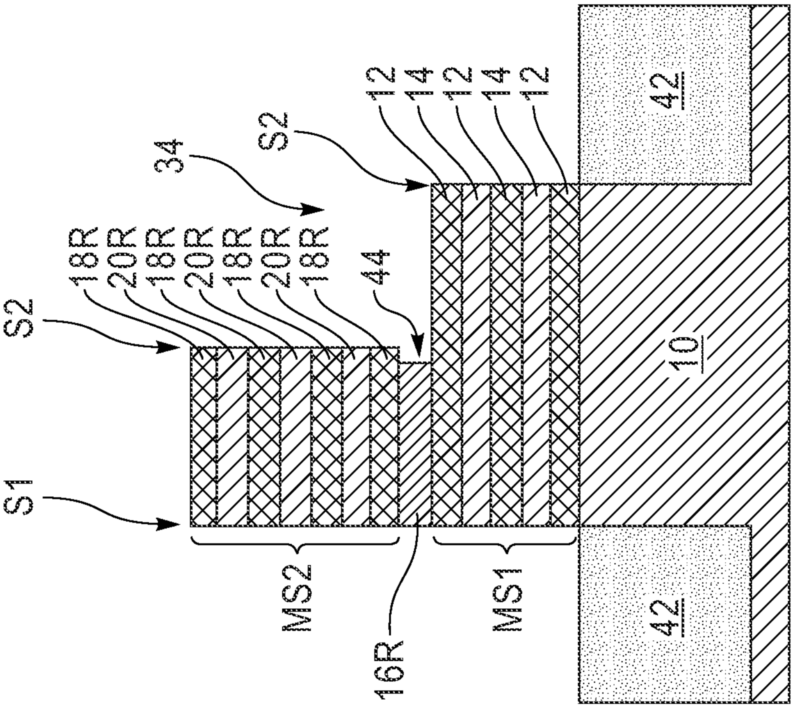
FIG. 14 is a cross sectional view of the exemplary structure shown in FIG. 13 after removing the hard mask and the etch stop layer.

Referring now to FIG. 14, there is illustrated the exemplary structure shown in FIG. 13 after removing the hard mask 22 and the etch stop layer 28. The hard mask 22 and the etch stop layer 28 can be removed utilizing one or more material removal processes. A single etch can be used in instances in which the hard mask 22 and the etch stop layer 28 are composed of a compositionally same material. After removing the etch stop layer 28, gap 44 forms between the bottom material stack, MS1, and the top material stack, MS2; gap 44 is located adjacent to the step region 34 of the structure.

As is shown in FIG. 14, the bottom material stack, MS1, and the top material stack, MS2, have first sidewalls 51 on the side thereof that is opposite to the step region 34 that are vertically aligned to each other, while on the side including the step region 34, the bottom material stack, MS1, and the top material stack, MS2, have second sidewalls S2 that are vertically offset from one another. Thus, and at this point of the present application, the various material layers present in the bottom material stack, MS1, are wider than the various material layers present in the top material stack. Note that no tapering of the top material stack, MS2, occurs. Thus, the top material stack, MS2, has a vertical profile.

Figure 15A:
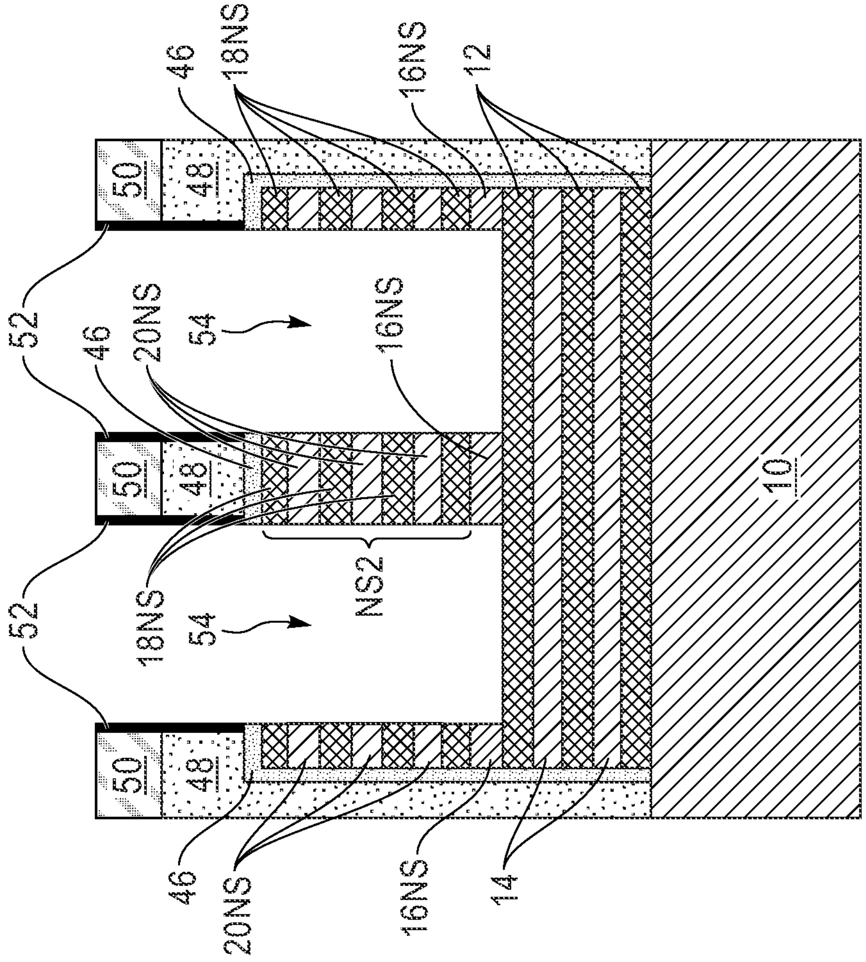
FIGS. 15A-15B are cross sectional views through cut X-X and cut Y-Y shown in FIG. 1, respectively, of the exemplary structure shown in FIG. 14 after further nanosheet device processing including formation of a dielectric oxide layer, forming a sacrificial gate structure, forming a gate spacer, patterning the top material stack and the recessed placeholder material layer into a second nanosheet-containing stack and into a placeholder material nanosheet, respectively, wherein during the patterning of the top material stack a top device source/drain area is provided.
Figure 15B:
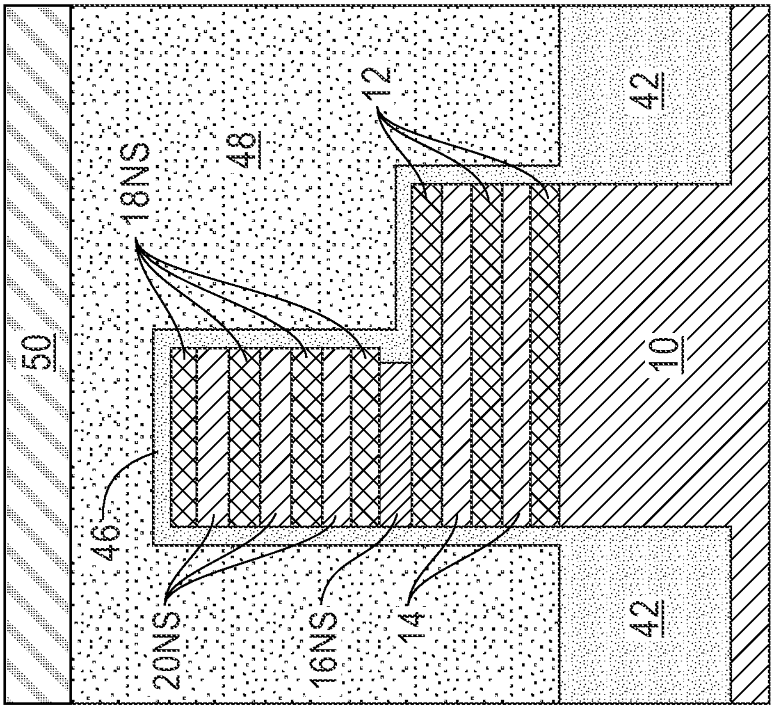

Referring now to FIGS. 15A-15B, there are illustrated the exemplary structure shown in FIG. 14 through X-X and Y-Y shown in FIG. 1, respectively, after further processing including formation of a dielectric oxide layer 46, forming a sacrificial gate structure 48, forming a gate spacer 52, patterning the top material stack, MS2, and the recessed placeholder material layer 16R into a second nanosheet-containing stack, NS2, and into a placeholder material nanosheet 16NS, respectively, wherein during the patterning of the top material stack, MS2, a top device source/drain area 54 is provided. It is noted the dielectric oxide layer 46 fills in gap 44.

The dielectric oxide layer 46 is composed of a dielectric oxide material having a dielectric constant of 4.0 or greater. Illustrative examples of dielectric oxide materials that can be employed as the dielectric oxide layer 46 include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb) O). The high-k gate dielectric material can further include dopants such as lanthanum (La), aluminum (Al) and/or magnesium (Mg).

The dielectric oxide material that provides the dielectric oxide layer 46 can be formed by a deposition process such as, for example, CVD, PECVD, ALD or PVD. The dielectric oxide layer 46 has a thickness from 2 nm to 15 nm. In some embodiments, the dielectric oxide layer 46 is a conformal layer; the term “conformal” denotes that a material layer has a thickness along a horizontal surface of another material that is substantially the same (i.e., within ±10%) as a thickness of the material layer along a vertical surface of the another material.

The sacrificial gate structure 48 is composed of a sacrificial gate material including, but not limited to, polysilicon, amorphous silicon, amorphous silicon germanium, tungsten, titanium, tantalum, aluminum, nickel, ruthenium, palladium, platinum, or alloys of such metals. The sacrificial gate material that provides the sacrificial gate structure 48 can be formed by a deposition process including, but not limited to, CVD, PECVD, ALD, PVD or sputtering.

In embodiments, a sacrificial hard mask cap 50 can be located on top of the sacrificial structure. In embodiments, the sacrificial hard mask cap 50 can be omitted. The sacrificial hard mask cap 50 is composed of a hard mask material such as, for example, silicon dioxide, silicon nitride, silicon oxynitride or any multilayered combination thereof. The hard mask that provides the sacrificial hard mask cap 50 can be formed by a deposition process including, but not limited to, CVD, PECVD, ALD, or PVD.

The dielectric oxide layer 46, sacrificial gate structure 48, and optional sacrificial gate cap 50, can be formed by depositing the various material layers that provide each of those elements then patterning these various deposited material layers by lithography and etching.

Gate dielectric spacers 52 are then formed along a sidewall of each sacrificial gate structure 48 and optional sacrificial gate cap 50 by a conformal spacer liner deposition followed by an anisotropic etch to remove any horizontal portions of the conformal spacer liner. Examples of dielectric materials for gate dielectric spacers 52 include, but are not limited to, SiN, SiBCN, SiOCN or SiOC.

After forming the gate dielectric spacers 52, the top material stack, MS2, and the recessed placeholder material layer 16R are patterned into a second nanosheet-containing stack, NS2, and into a placeholder material nanosheet 16NS, respectively, wherein during the patterning of the top material stack, MS2, a top device source/drain area 54 is provided. This patterning step utilizes each sacrificial gate structure 48, if present each sacrificial gate cap 50, and the gate dielectric spacers 52 as an etch mask. The patterning includes an etching process which removes physically exposed portions of the second material stack, MS2, not protected by the etch mask, while maintaining a portion of the second material stack, MS2, beneath each etch mask. The recessed placeholder material layer 16R that lies beneath the removed portion of the second material stack is also removed. The maintained portion of the second material stack, MS2 that is located beneath each etch mask provides the second nanosheet-containing stack, NS2, which includes alternating nanosheets of top device sacrificial semiconductor material 18NS and top device semiconductor channel material 20NS. Each top device sacrificial semiconductor material nanosheet 18NS is composed of the third semiconductor material as mentioned above for the top device sacrificial semiconductor material layers 18, and each top device semiconductor channel material nanosheet 20NS is composed of the fourth semiconductor material as mentioned above for the top device semiconductor channel material layers 20. The etch stops on a surface of first material stack, MS1.

Figure 16A:
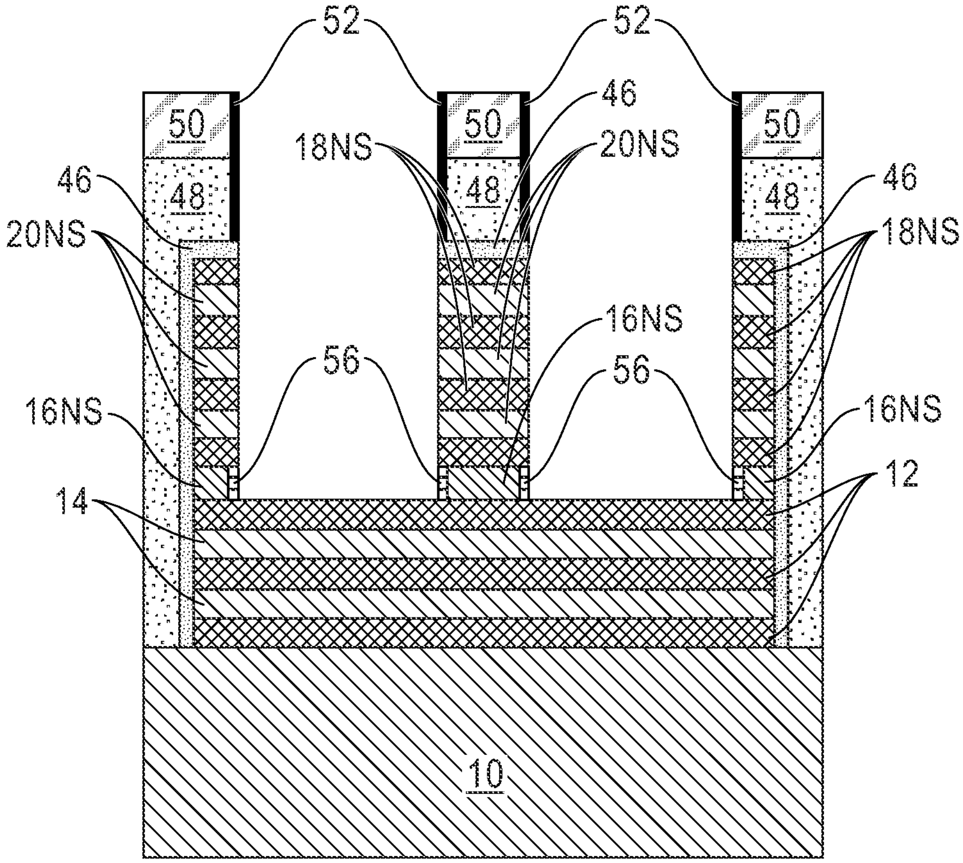
FIGS. 16A, 16B and 16C are cross sectional views through cut X-X, cut Y-Y, and cut Z-Z shown in FIG. 1, respectively, of the exemplary structure shown in FIGS. 15A-15B after recessing the sacrificial placeholder material nanosheet, and forming a first inner spacer laterally adjacent to the recessed placeholder material nanosheet.
Figure 16C:
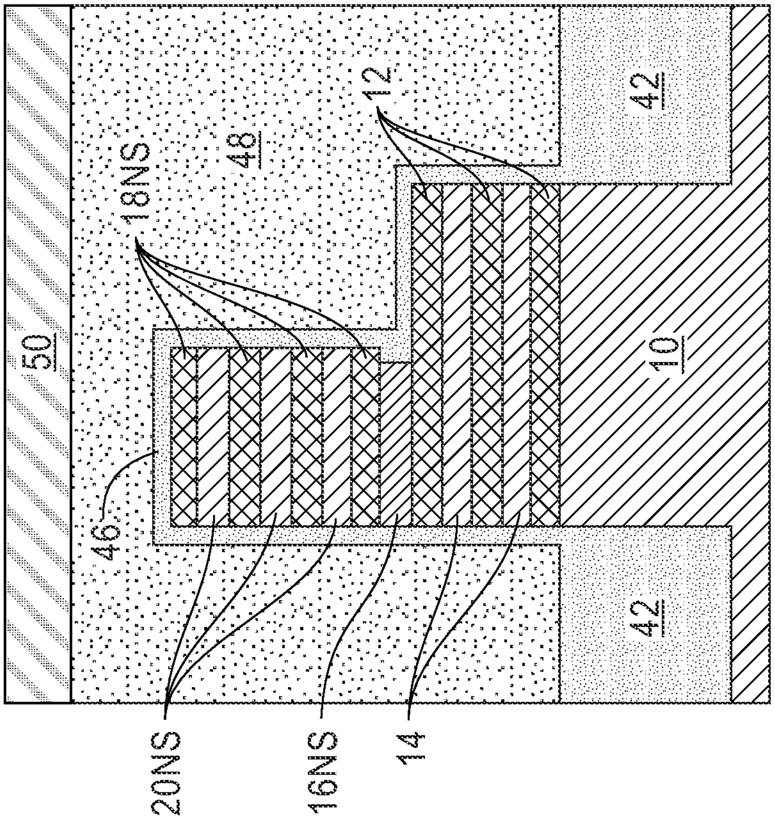
Figure 16B:
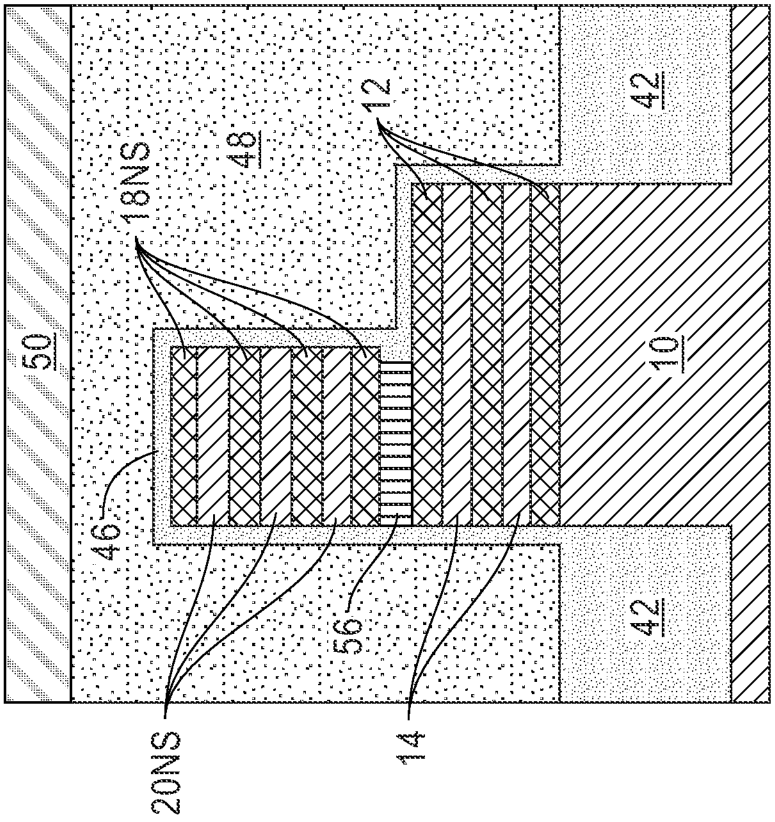

Referring now to FIGS. 16A, 16B and 16C, there is illustrated the exemplary structure shown in FIGS. 15A and 15B through cuts X-X, Y-Y and Z-Z shown in FIG. 1, respectively, after recessing the sacrificial placeholder material nanosheet 16NS, and forming a bottom-top device separating inner spacer 56 laterally adjacent to the recessed placeholder material nanosheet 16NS. The recessing of the sacrificial placeholder material nanosheet 16NS includes a lateral etching process that is selective in removing the fifth semiconductor material mentioned above for providing the sacrificial placeholder material nanosheet 16NS. The recessed sacrificial placeholder material nanosheet 16NS has a width that is less than the width of the non-recessed sacrificial placeholder material nanosheet 16NS.

The bottom-top device separating inner spacer 56 is then formed in a gap created by the recessing of the sacrificial placeholder material nanosheet 16NS. The forming of the bottom-top device separating inner spacer 56 includes conformal deposition of inner dielectric spacer material and followed by an isotropic etching. The inner dielectric spacer material can be compositionally the same as, or compositionally different from, the dielectric spacer material that provides gate dielectric spacer 52. As is illustrated in FIG. 16A, the bottom-top device separating inner spacer 56 has a first sidewall that is in direct physical contact with a sidewall of the recessed sacrificial placeholder material nanosheet 16NS and a second sidewall, opposite the first sidewall that is vertical aligned to the second nanosheet-containing stack, NS2.

Figure 17A:
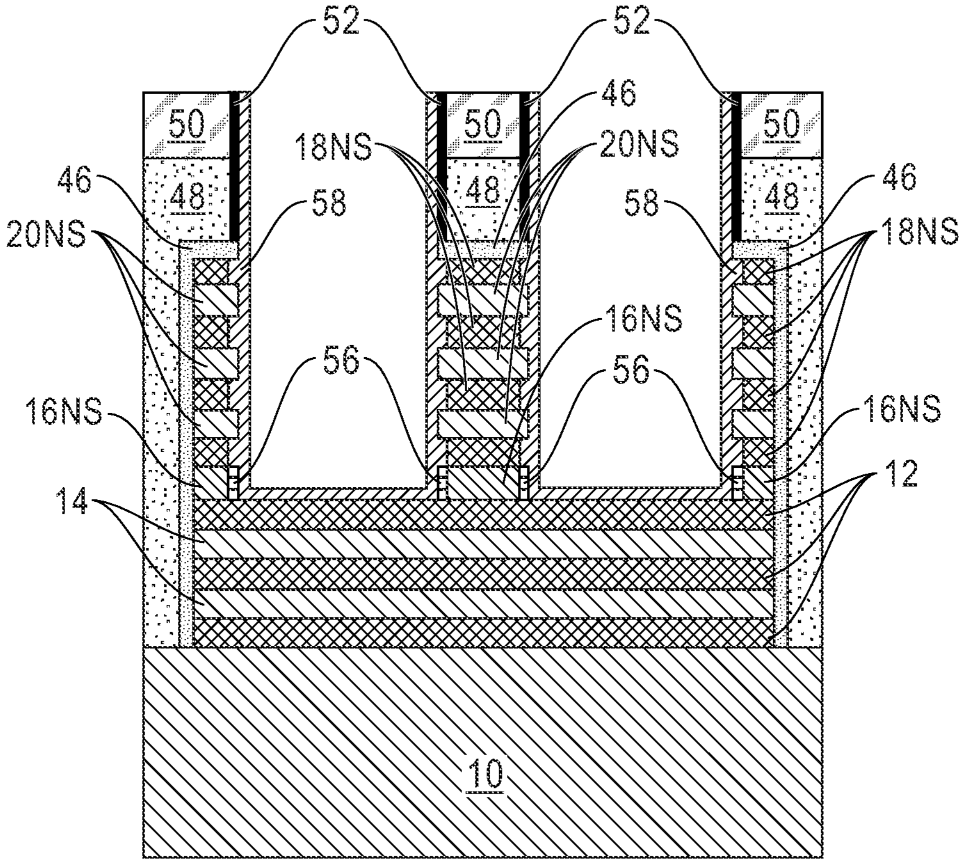
FIGS. 17A, 17B and 17C are cross sectional views through cut X-X, cut Y-Y, and cut Z-Z shown in FIG. 1, respectively, of the exemplary structure shown in FIGS. 16A, 16B and 16C after recessing each top device sacrificial semiconductor material nanosheet of the second nanosheet-containing stack and forming a top device inner spacer dielectric material layer.
Figure 17B:
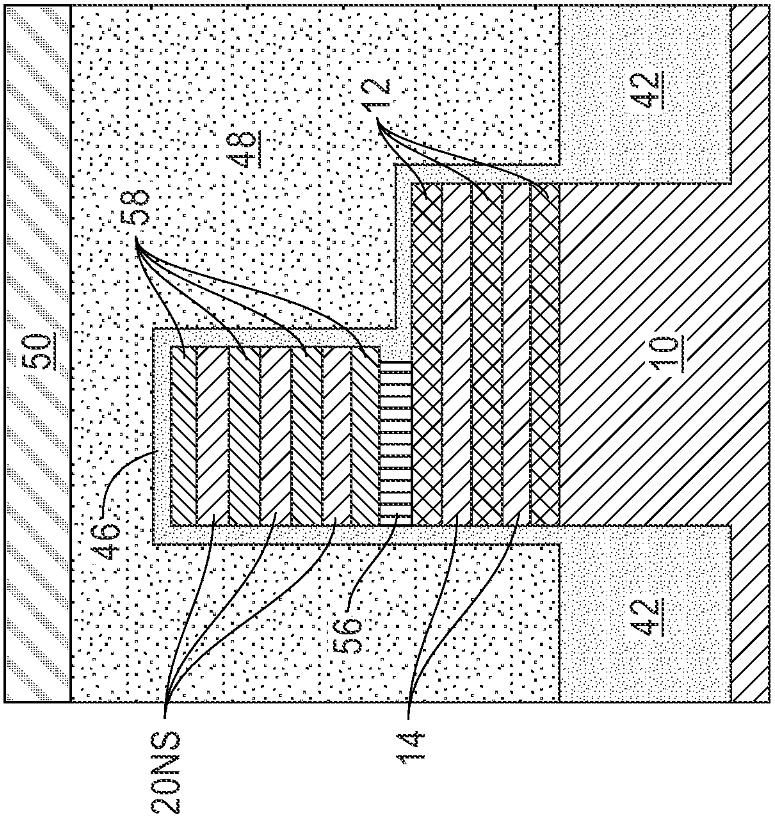
Figure 17C:
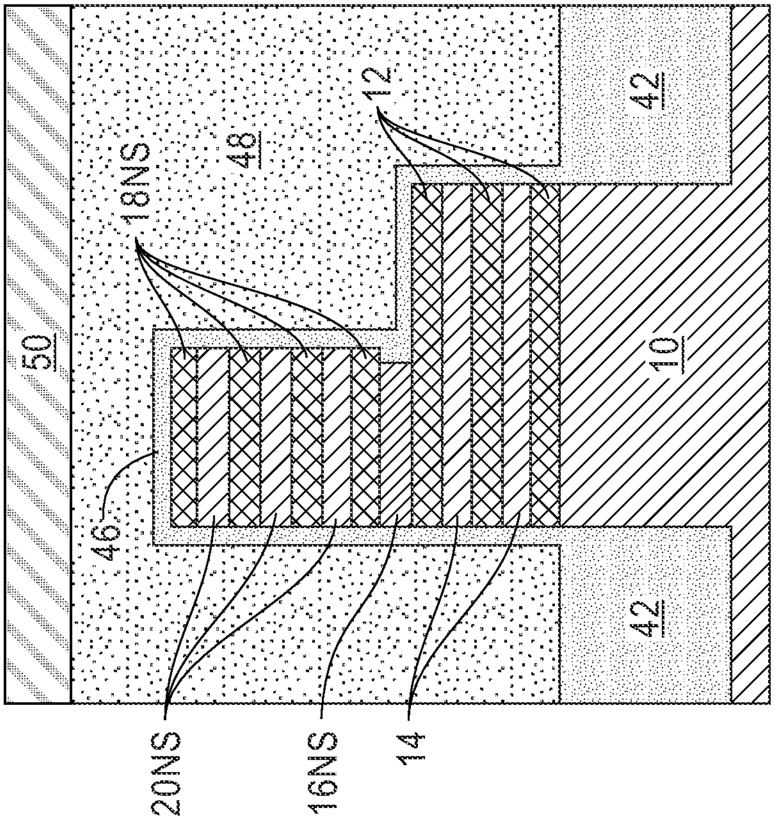

Referring now to FIGS. 17A, 17B and 17C, there is illustrated the exemplary structure shown in FIGS. 16A, 16B, and 16C, respectively, after recessing each top device sacrificial semiconductor material nanosheet 18NS of the second nanosheet-containing stack, NS2, and forming a top device inner spacer dielectric material layer 58. Each top device sacrificial semiconductor material nanosheet 18NS of the second nanosheet-containing stack, NS2, can be recessed utilizing a lateral etching process that is selective in removing the third semiconductor material mentioned above. Next, a top device inner spacer dielectric material layer 58 is formed along the sidewalls of the gate dielectric spacers 52 and along the sidewalls of the second nanosheet-containing stack, NS2. The top device inner spacer dielectric material layer 58 fills in each gap that is created during the recessing of the top device sacrificial semiconductor material nanosheets 18NS, and is formed along a topmost surface of the underlying first material stack, MS1.

The forming of the top device inner spacer dielectric material layer 58 includes conformal deposition of another, i.e., second, inner dielectric spacer material. The second inner dielectric spacer material that provides the top device inner spacer dielectric material layer 58 can be compositionally the same as, or compositionally different from, the first inner dielectric spacer material that provides bottom-top device separating inner spacer 56.

Figure 18A:
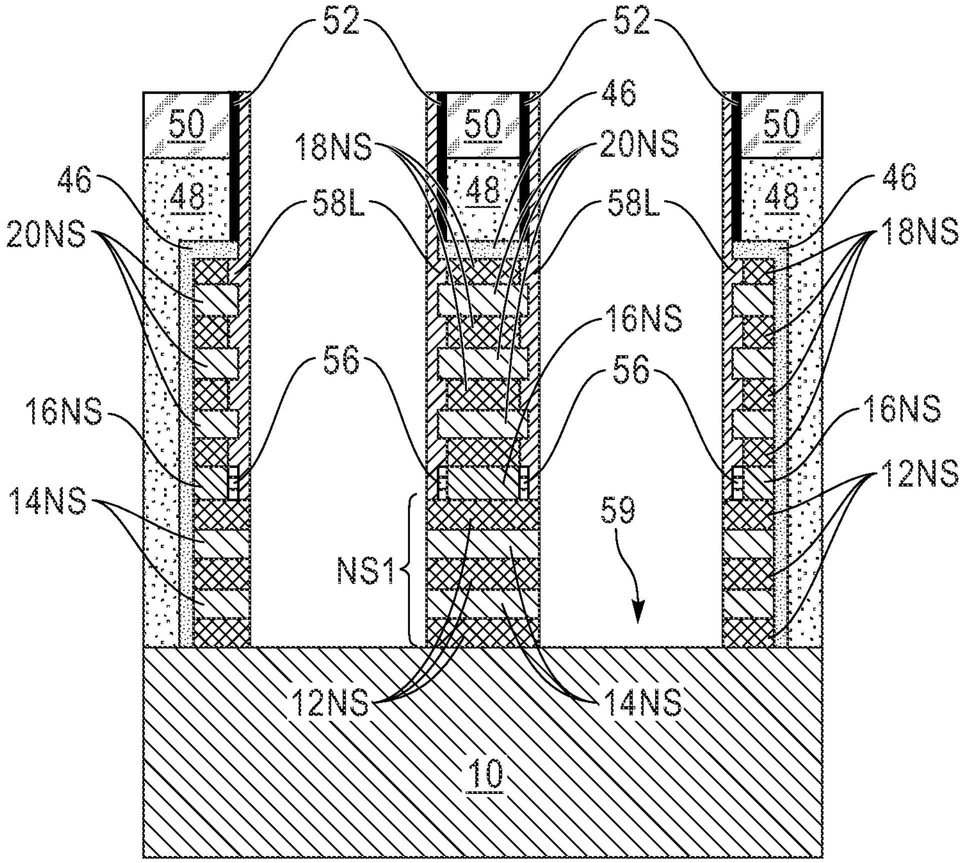
FIGS. 18A, 18B and 18C are cross sectional views through cut X-X, cut Y-Y, and cut Z-Z shown in FIG. 1, respectively, of the exemplary structure shown in FIGS. 17A, 17B and 17C after patterning the bottom material stack into a first nanosheet-containing stack, wherein during the patterning of the bottom material stack a horizontal portion of the top device inner spacer dielectric material layer is removed and a bottom device source/drain area is provided.
Figure 18C:
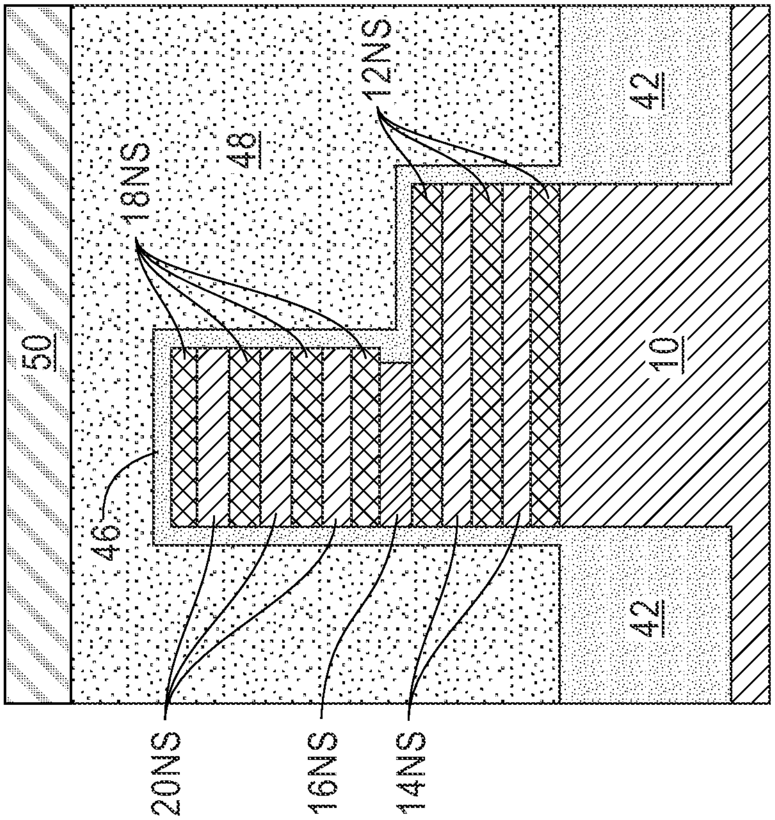
Figure 18B:
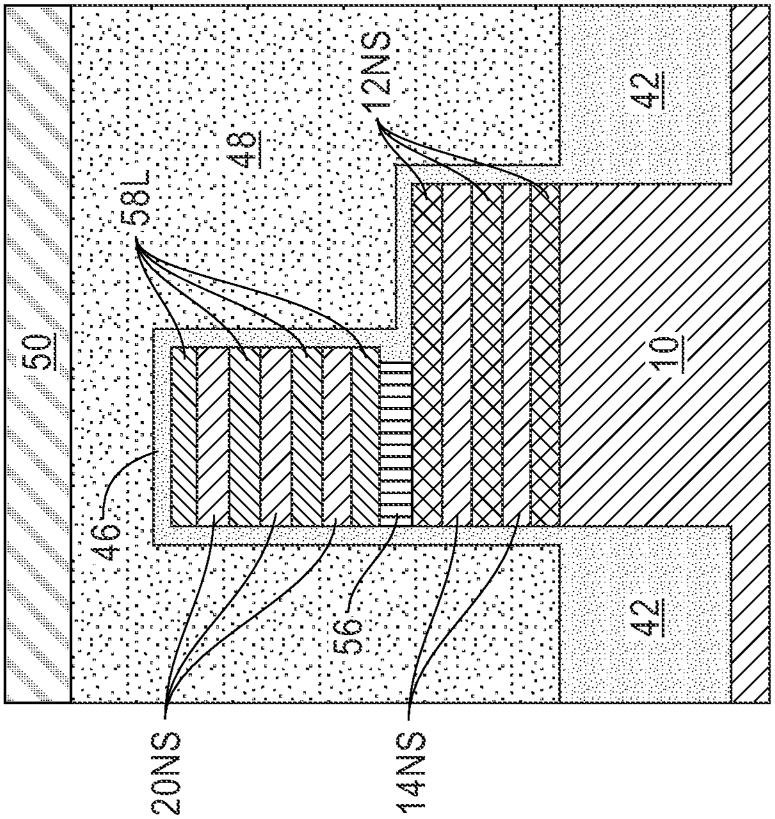

Referring now to FIGS. 18A, 18B and 18C, there is illustrated the exemplary structure shown in FIGS. 17A, 17B, and 17C, respectively, after patterning the bottom material stack, MS1, into a first nanosheet-containing stack, NS1, wherein during the patterning of the bottom material stack, MS1, a horizontal portion of the top device inner spacer dielectric material layer 58 is removed and a bottom device source/drain area 59 is provided. This patterning step utilizes the sacrificial gate structure 48, if present the sacrificial gate cap 50, and the gate dielectric spacers 52 as an etch mask.

The patterning includes one or more etching process which first removes the physically exposed horizontal portion of the top device inner spacer dielectric material layer 58 (the remaining top device inner spacer dielectric material layer 58 is referred to herein as top device inner spacer dielectric material liner 58L), and the physically exposed portions of the first material stack, MS1, not protected by the etch mask, while maintaining a portion of the first material stack, MS1, beneath each etch mask, and beneath each second nanosheet-containing stack, NS2. The maintained portion of the first material stack, MS1 provides the first nanosheet-containing stack, NS1, which includes alternating nanosheets of bottom device sacrificial semiconductor material 12NS and bottom device semiconductor channel material 14NS. Each bottom device sacrificial semiconductor material nanosheet 12NS is composed of the first semiconductor material as mentioned above for the bottom device sacrificial semiconductor material layers 12, and each bottom device semiconductor channel material nanosheet 14NS is composed of the second semiconductor material as mentioned above for the bottom device semiconductor channel material layers 14. The etch stops on a semiconductor material surface of semiconductor substrate 10.

Figure 19A:
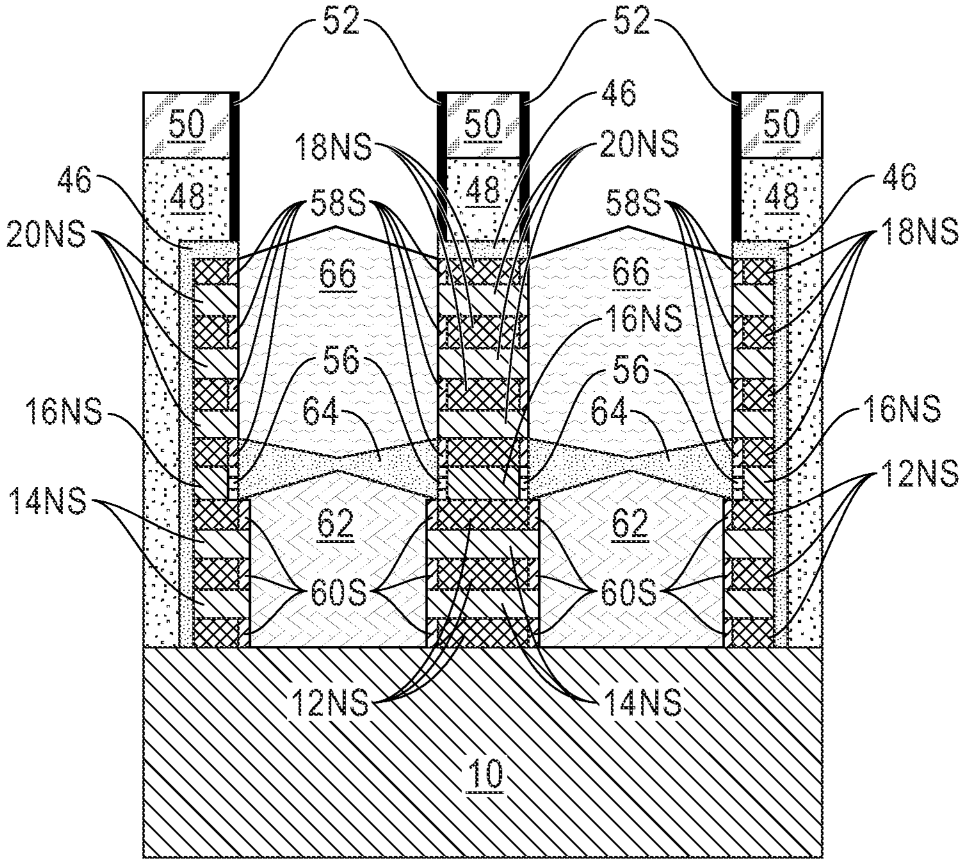
FIGS. 19A, 19B and 19C are cross sectional views through cut X-X, cut Y-Y, and cut Z-Z shown in FIG. 1, respectively, of the exemplary structure shown in FIGS. 18A, 18B and 18C after recessing each bottom device sacrificial semiconductor material nanosheet of the first nanosheet-containing stack, forming a bottom device inner spacer layer adjacent to each recessed bottom device sacrificial semiconductor material nanosheet, forming a bottom device source/drain structure, a dielectric material layer, and a top device source/drain structure, wherein during the forming of the bottom device inner spacer a portion of the remaining top device inner spacer dielectric material layer is removed, while maintaining a portion of the top device inner spacer dielectric material layer latterly adjacent to each recessed top device sacrificial semiconductor material nanosheet.
Figure 19C:
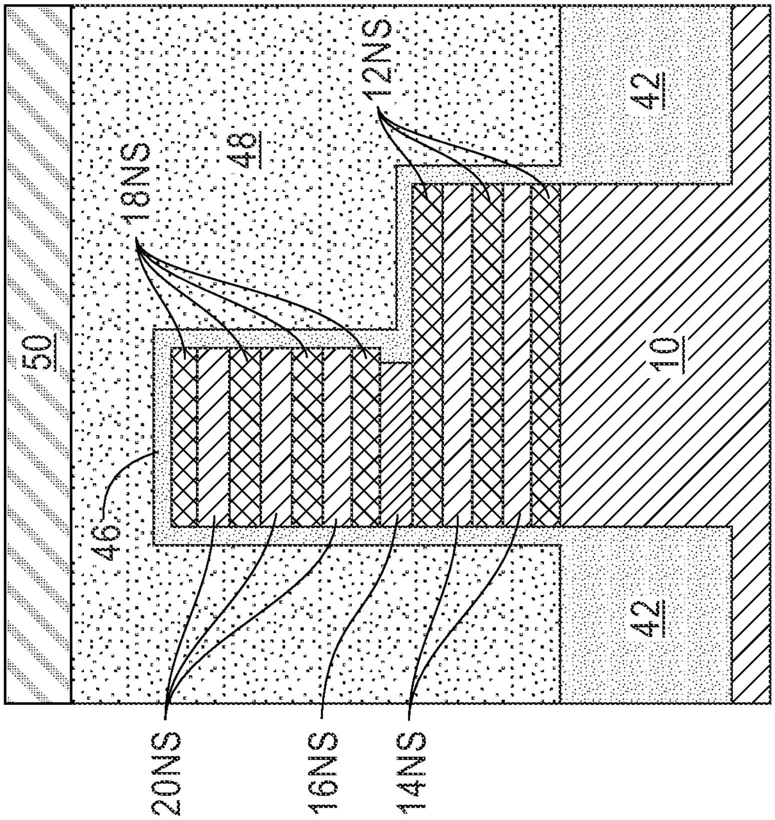
Figure 19B:
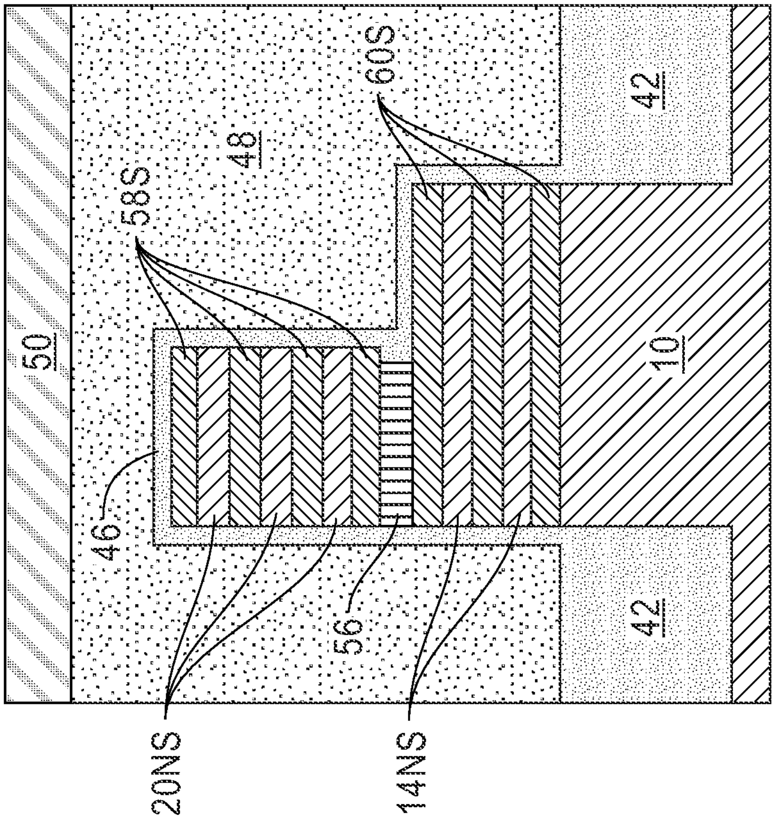

Referring now to FIGS. 19A, 19B and 19C, there is illustrated the exemplary structure shown in FIGS. 18A, 18B, and 18C, respectively, after recessing each bottom device sacrificial semiconductor material nanosheet 12NS of the first nanosheet-containing stack, NS1, forming a bottom device inner spacer 60S laterally adjacent to each recessed bottom device sacrificial semiconductor material nanosheet 12NS, forming a bottom device source/drain structure 62, a dielectric material layer 64, and a top device source/drain structure 66, wherein during the forming of the bottom device inner spacer 60S a portion of the remaining top device inner spacer dielectric material layer (i.e., top device inner spacer liner 58L) is removed, while maintaining a portion of the remaining top device inner spacer dielectric material layer laterally adjacent to each recessed top device sacrificial semiconductor material nanosheet 18NS. The remaining top device inner spacer dielectric material is referred to as top device inner spacer 58S.

Each bottom device sacrificial semiconductor material nanosheet 12NS of the first nanosheet-containing stack, NS1, can be recessed utilizing a lateral etching process that is selective in removing the first semiconductor material mentioned above. Next, a bottom device inner spacer dielectric material layer is formed in the top and bottom source/drain regions including along the sidewalls of the first nanosheet-containing stack, NS1. The bottom device inner spacer dielectric material layer fills in each gap that is created during the recessing of the bottom device sacrificial semiconductor material nanosheets 12NS. The forming of the bottom device inner spacer dielectric material layer includes conformal deposition of third inner dielectric spacer material. The third inner dielectric spacer material that provides the bottom device inner spacer dielectric material layer can be compositionally the same as, or compositionally different from, the first inner dielectric spacer material and/or the second inner dielectric spacer material. Following the formation of a bottom device inner spacer dielectric material layer, an isotropic etch is performed to provide bottom device inner spacer 60S; during this etch top device inner spacers 58S are also formed.

Each top device inner spacer 58S has a first sidewall that directly contacts a sidewall of a laterally adjacent recessed top device sacrificial semiconductor material nanosheet 18NS. Each bottom device inner spacer 60S has a first sidewall that directly contacts a sidewall of a laterally adjacent recessed bottom device sacrificial semiconductor material nanosheet 12NS.

The bottom device source/drain structure 62 is then formed in the bottom device source/drain area 59. As used herein, a "source/drain" structure can be a source or a drain depending on subsequent wiring and application of voltages during operation of the FET. The bottom device source/drain structure 62 has a sidewall that is in direct physical contact with the sidewalls of each bottom device semiconductor channel material nanosheet 14NS. The bottom device source/drain structure 62 includes a semiconductor material and a first dopant. The semiconductor material that provides each bottom device source/drain structure 62 can include Si, SiGe, SiC, or combination of those materials. The first dopant can be a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each bottom device source/drain structure 62 can have a dopant concentration of from $4\times10^{20}$ atoms/$cm^3$ to $3\times10^{21}$ atoms/$cm^3$. The bottom device source/drain structure 62 can be formed by an epitaxial growth in which the first dopant is present during the epitaxial growth process. The bottom device source/drain structure 62 grow laterally outward from each of the bottom device semiconductor channel material nanosheet 14NS and upwards from the physically exposed surface of semiconductor substrate 10. A recess etch can be optionally employed so as to reduce the height of bottom device source/drain structure 62, and to ensure that the bottom device source/drain structure is kept within the bottom source/drain area 59.

The dielectric material layer 64, which separates the bottom device source/drain structure 62 from the top device source/drain structure 66, includes a dielectric material such as, for example, silicon nitride, silicon oxynitride, or silicon dioxide. The dielectric material layer 64 can be formed by a deposition process such as, for example, CVD, PECVD, PVD or ALD, and an optional etch back process can follow the deposition process. The dielectric material layer 62 is present in between the top device source/drain area 54 and bottom device source/drain area 59 and it does not extend above the bottommost surface of the bottommost top device semiconductor channel material nanosheet and a topmost surface of the topmost bottom device semiconductor channel material nanosheet.

The top device source/drain structure 66 is then formed in the top device source/drain area 54. The top device source/drain structure 66 has a sidewall that is in direct physical contact with the sidewalls of each top device semiconductor channel material nanosheet 20NS. The top device source/drain structure 66 includes a semiconductor material and a second dopant, which can be of a same conductivity type, or a different conductivity type, as the first dopant. The semiconductor material that provides the top device source/drain structure 66 includes one of the semiconductor materials mentioned above for the bottom device source/drain structure 62. The top device source/drain structure 66 can be formed utilizing the same technique as mentioned above in forming the bottom device source/drain structure 62.

Figure 20A:
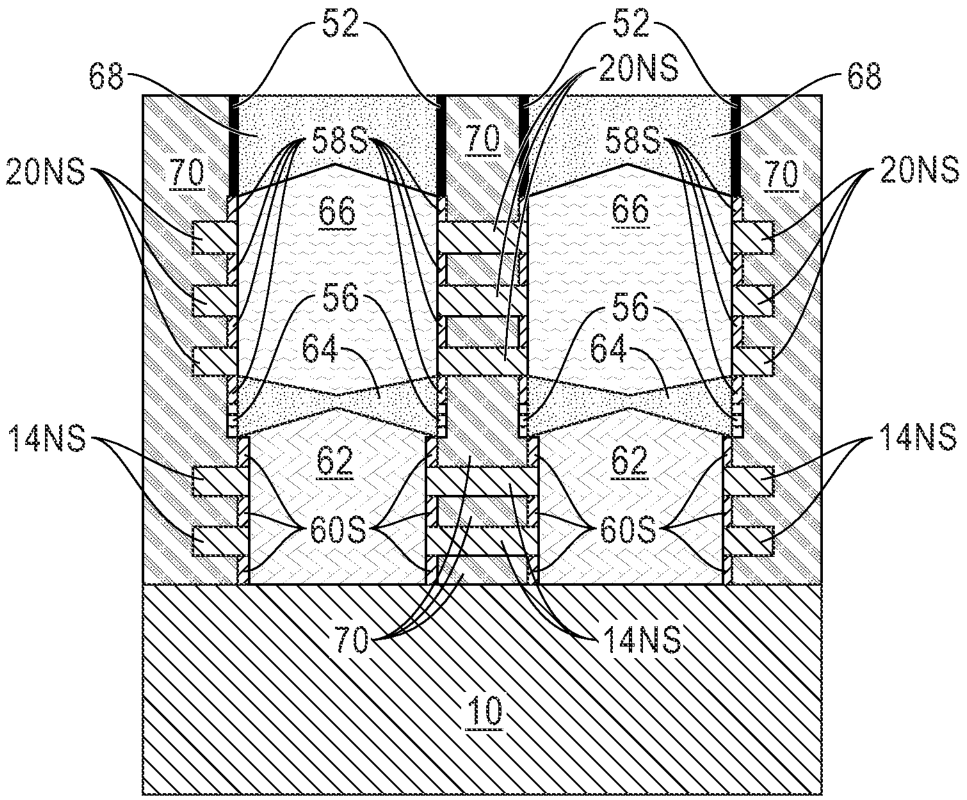
FIGS. 20A, 20B and 20C are cross sectional views through cut X-X, cut Y-Y, and cut Z-Z shown in FIG. 1, respectively, of the exemplary structure shown in FIGS. 19A, 19B and 19C after forming an interlayer dielectric (ILD) material layer on top of the top source/drain structure, removing each of the recessed top device sacrificial semiconductor material nanosheets and each of the recessed bottom device sacrificial semiconductor material nanosheets to provide a vertical nanosheet stack of suspended and spaced apart bottom device semiconductor channel material nanosheets, and suspended and spaced apart top device semiconductor channel material nanosheets, and forming a functional gate structure wrapping around the suspended portion of each suspended bottom device semiconductor channel material nanosheet and the suspended portion of each top device semiconductor channel material nanosheet.
Figure 20C:
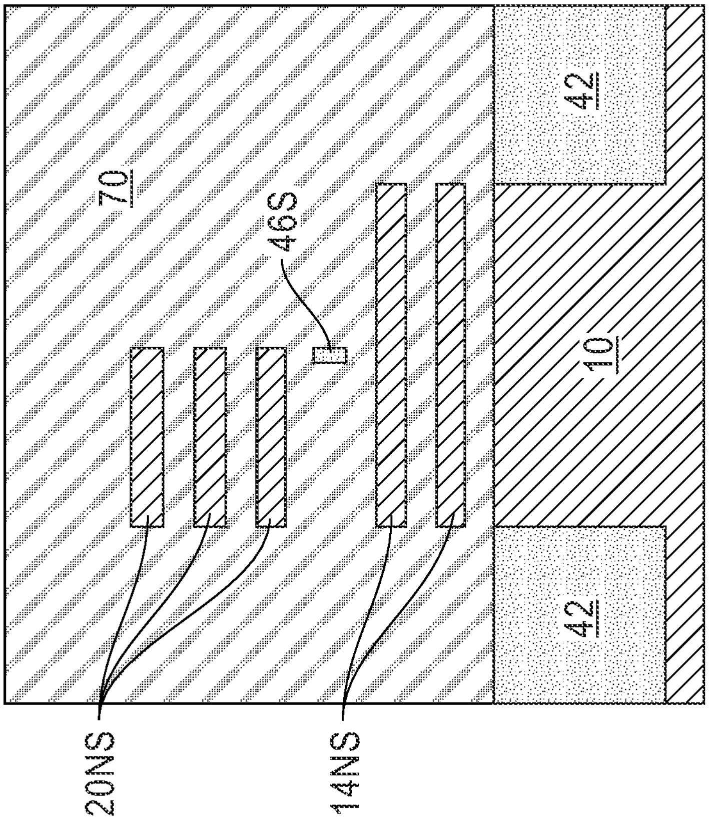
Figure 20B:
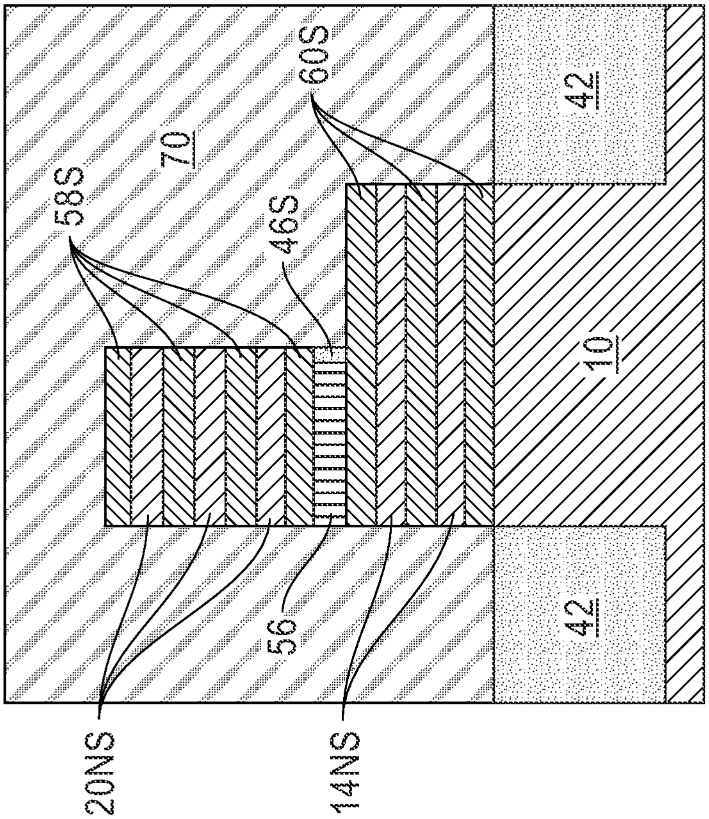

Referring now to FIGS. 20A, 20B and 20C, there is illustrated the exemplary structure shown in FIGS. 19A, 19B, and 19C, respectively, after forming an ILD material layer 68 on top of the top source/drain structure 66, removing each of the recessed top device sacrificial semiconductor material nanosheets 18NS and each of the recessed bottom device sacrificial semiconductor material nanosheets 12NS to provide a vertical nanosheet stack of suspended and spaced apart bottom device semiconductor channel material nanosheets 14NS, and suspended and spaced apart top device semiconductor channel material nanosheets 20NS, and forming a functional gate structure 70 wrapping around the suspended portion of each bottom device semiconductor channel material nanosheets 14NS and the suspended portion of each top device semiconductor channel material nanosheet 20NS.

The ILD material layer 68 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the ILD material layer 68 can include a multilayered structure that includes at least two different dielectric materials stacked one atop the other such as, for example, silicon nitride and silicon dioxide. The ILD material layer 68 can be formed by a deposition process such as, for example, CVD, PECVD, or spin-on coating. A planarization process such as, for example, CMP, can be performed after the deposition of the dielectric material that provides the ILD material layer 68.

After forming the ILD material layer 68 and prior to removing each of the recessed top device sacrificial semiconductor material nanosheets 18NS and each of the recessed bottom device sacrificial semiconductor material nanosheets 12NS, the optional sacrificial gate 50, sacrificial gate structure 48, and a portion of the dielectric oxide layer 46 are removed utilizing one or more etching steps to reveal the vertical nanosheet-containing stack. The one or more etching steps used to reveal the vertical nanosheet-containing stack can include a hot ammonia wet clean. A portion of the dielectric material liner 46 remains between a portion of the top device nanosheet-containing stack, NS2, and the bottom device nanosheet-containing stack, NS1, in a region in close proximity to the step region 34. The dielectric oxide layer that remains is referred to herein as a dielectric oxide structure 46S.

Each of the recessed top device sacrificial semiconductor material nanosheets 18NS and each of the recessed bottom device sacrificial semiconductor material nano sheets 12NS are then removed utilizing one or more etching steps that is selective in removing the first and third semiconductor materials mentioned above relative to the second and fourth semiconductor materials mentioned above. In one example, a vapor phased HCl dry etch can be used to remove each of the recessed top device sacrificial semiconductor material nanosheets 18NS and each of the recessed bottom device sacrificial semiconductor material nanosheets 12NS, See, for example, FIG. 20C Next, functional gate structure 70 is formed. The functional gate structure 70 includes at least a gate dielectric material layer and a gate electrode; both of which are not individually shown in the drawings of the present application. In the present application, the gate dielectric material layer of the functional gate structure 70 is in direct contact with physically exposed portions of each bottom device semiconductor channel material nanosheet 14NS and each physically exposed portions of each top device semiconductor channel material nanosheet 20NS, and the gate electrode is located on the gate dielectric material layer. In some embodiments, the functional gate structure 70 includes a work function metal (WFM) layer located between the gate dielectric material layer and the gate electrode. In some embodiments, the WFM serves as the sole gate electrode material. In some embodiments (not shown), a gate cap is located above a recessed functional gate structure 70. In other embodiments, a gate cap is omitted.

The functional gate structure 70 includes forming a continuous layer of gate dielectric material and a gate electrode material. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The high-k gate dielectric material can further include dopants such as lanthanum (La), aluminum (Al) and/or magnesium (Mg). The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_X$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, can be used to provide a planarized functional gate structure 70.

When present the gate cap is composed of a hard mask material such as, for example, silicon dioxide or silicon nitride. The gate cap can be formed by recessing the gate electrode, depositing a hard mask material and, planarizing the deposited hard mask material.

FIGS. 20A, 20B and 20C illustrate a semiconductor structure in accordance with the present application. The semiconductor structure includes a bottom nanosheet device including a bottom stack of spaced apart bottom device semiconductor channel material nanosheets 14NS. A top nanosheet device is located above the bottom nanosheet device and the top nanosheet device includes a top stack of spaced apart top device semiconductor channel material nanosheets 20NS. The bottom stack of spaced apart bottom device semiconductor channel material nanosheets 14NS and the top stack of spaced apart top device semiconductor channel material nanosheets 20NS are arranged in a step configuration, as is seen in FIGS. 20B and 20C. Dielectric oxide structure 46S is located between the bottom nanosheet device and the top nanosheet device, wherein the dielectric oxide structure 46S is spaced apart from a bottommost top device semiconductor channel nanosheet and a topmost bottom device semiconductor channel nanosheet. The bottom nanosheet device is of a first conductivity type (i.e., n-type or p-type) and the top nanosheet device is a second conductivity type (n-type or p-type), wherein the first conductivity type is the same as, or different from, the second conductivity type.

As is further illustrated in FIGS. 20A, 20B and 20C, each bottom device semiconductor channel material nanosheet 14NS of the bottom stack of spaced apart bottom device semiconductor channel material nanosheets has a first width and each top device semiconductor channel material nanosheet 20NS of the top stack of spaced apart top device semiconductor channel material nanosheets, has a second width, wherein the first width is greater than the second width. Step region 34 is present, and the dielectric oxide structure 46S is located adjacent to the step region 34. The structure further includes bottom-top device separating inner spacer 56 located between the top nanosheet device and the bottom nanosheet device, wherein the bottom-top device separating inner spacer 56 has a first sidewall that is vertically aligned to a first sidewall of the top stack of spaced apart top device semiconductor channel material nanosheets 20NS, and a second sidewall opposite the first sidewall, that is in direct physical contact with a first sidewall of the dielectric oxide structure 46S, See FIG. 20B. The dielectric oxide structure 46S includes a second sidewall that is opposite the first sidewall of the dielectric oxide structure 46S that is vertically aligned with a second sidewall of the top stack of spaced apart top device semiconductor channel material nanosheets 20NS, wherein the second sidewall of the first sidewall of the top stack of spaced apart top device semiconductor channel material nanosheets 20NS is opposite the first sidewall of the first sidewall of the top stack of spaced apart top device semiconductor channel material nanosheets 20NS.

The structure further includes a top device inner spacer 58S located between each top device semiconductor channel material nanosheet 20NS of the top stack of spaced apart top device semiconductor channel material nanosheets, and a bottom device inner spacer 60S located between each bottom device semiconductor channel material nanosheet 14NS of the bottom stack of spaced apart bottom device semiconductor channel material nanosheets. In accordance with the present application, and as illustrated in FIG. 20B, the bottom device inner spacer 60S has the first width, and the top device inner spacer 58S has the second width. In the structure of the present application, the dielectric oxide structure 46S and the bottom-top device separating inner spacer 56 both contact a bottommost top device inner spacer and a topmost bottom device inner spacer, See, FIG. 20B.

As shown in FIG. 20C, functional gate structure 70 wraps around each top device semiconductor channel material nanosheets 20NS of the top stack of spaced apart top device semiconductor channel material nanosheets, and each bottom device semiconductor channel material nanosheets 14NS of the bottom stack of spaced apart bottom device semiconductor channel material nanosheets. Also, functional gate structure 70 wraps around the dielectric oxide structure 46S.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a bottom nanosheet device comprising a bottom stack of spaced apart bottom device semiconductor channel material nanosheets, each bottom device semiconductor channel material nanosheet of the bottom stack of spaced apart bottom device semiconductor channel material nanosheets has a first width;

a top nanosheet device located above the bottom nanosheet device and comprising a top stack of spaced apart top device semiconductor channel material nanosheets, wherein each top device semiconductor channel material nanosheet of the top stack of spaced apart top device semiconductor channel material nanosheets, has a second width, wherein the first width is greater than the second width and the bottom stack of spaced apart bottom device semiconductor channel material nanosheets and the top stack of spaced apart top device semiconductor channel material nanosheets are arranged in a step configuration;

a dielectric oxide structure located between the bottom nanosheet device and the top nanosheet device, wherein the dielectric oxide structure is spaced apart from a bottommost top device semiconductor channel nanosheet and a topmost bottom device semiconductor channel nanosheet; and a bottom-top device separating inner spacer located between the top nanosheet device and the bottom nanosheet device, wherein the bottom-top device separating inner spacer has a first sidewall that is vertically aligned to a first sidewall of the top stack of spaced apart top device semiconductor channel material nanosheets, and a second sidewall opposite the first sidewall, that is in direct physical contact with a first sidewall of the dielectric oxide structure, wherein the dielectric oxide structure includes a second sidewall that is opposite the first sidewall of the dielectric oxide structure that is vertically aligned with a second sidewall of the top stack of spaced apart top device semiconductor channel material nanosheets, wherein the second sidewall of the top stack of spaced apart top device semiconductor channel material nanosheets is opposite the first sidewall of the top stack of spaced apart top device semiconductor channel material nanosheets.

2. The semiconductor structure of claim 1, wherein the dielectric oxide structure is composed of a dielectric material that is compositionally different from a dielectric material that provides the bottom-top device separating inner spacer.

3. The semiconductor structure of claim 1, wherein the dielectric oxide structure is composed of a dielectric material that is compositionally a same dielectric material that provides the bottom-top device separating inner spacer.

4. The semiconductor structure of claim 1, further comprising a top device inner spacer located between each top device semiconductor channel material nanosheet of the top stack of spaced apart top device semiconductor channel material nanosheets, and a bottom device inner spacer located between each bottom device semiconductor channel material nanosheet of the bottom stack of spaced apart bottom device semiconductor channel material nanosheets.

5. The semiconductor structure of claim 4, wherein the bottom device inner spacer has the first width, and the top device inner spacer has the second width.

6. The semiconductor structure of claim 5, wherein the dielectric oxide structure and the bottom-top device separating inner spacer both contact a bottommost top device inner spacer and a topmost bottom device inner spacer.

7. The semiconductor structure of claim 1, wherein the step configuration includes a step region, and the dielectric oxide structure is located adjacent to the step region.

8. The semiconductor structure of claim 1, further comprising a functional gate structure wrapping around each top device semiconductor channel material nanosheet of the top stack of spaced apart top device semiconductor channel material nanosheets, and each bottom device semiconductor channel material nanosheet of the bottom stack of spaced apart bottom device semiconductor channel material nanosheets.

9. The semiconductor structure of claim 8, wherein the functional gate structure further wraps around the dielectric oxide structure.

10. The semiconductor structure of claim 9, wherein the functional gate structure includes a gate dielectric material layer and a gate electrode.

11. The semiconductor structure of claim 1, further comprising a bottom device source/drain structure extending from a sidewall of each bottom device semiconductor channel material nanosheet of the bottom stack of spaced apart bottom device semiconductor channel material nanosheets, and a top device source/drain structure extending from a sidewall of each top device semiconductor channel material nanosheet of the top stack of spaced apart top device semiconductor channel material nanosheets.

12. The semiconductor structure of claim 11, further comprising a dielectric material layer located between the bottom device source/drain structure and the top device source/drain structure.

13. The semiconductor structure of claim 11, further comprising an interlayer dielectric material located on top of the top device source/drain structure.

14. The semiconductor structure of claim 1, wherein the bottom nanosheet device is of a first conductivity type and the top nanosheet device is a second conductivity type, wherein the second conductivity type is different from the first conductivity type.

15. The semiconductor structure of claim 1, wherein the bottom nanosheet device is of a first conductivity type and the top nanosheet device is a second conductivity type, wherein the second conductivity type and the first conductivity type are of a same conductivity.

16. The semiconductor structure of claim 1, wherein the bottom nanosheet device and the top nanosheet device are stacked on top of a mesa region of a semiconductor substrate.

17. The semiconductor structure of claim 16, further comprising a trench isolation structure laterally adjacent to the mesa region of the semiconductor substrate.

* * * * *